United States Patent
Takizawa et al.

(10) Patent No.: US 11,322,584 B2
(45) Date of Patent: May 3, 2022

(54) SEMICONDUCTOR DEVICE AND MANUFACTURING METHOD FOR SAME

(71) Applicant: DENSO CORPORATION, Kariya (JP)

(72) Inventors: Shin Takizawa, Kariya (JP); Yusuke Nonaka, Kariya (JP); Shinichirou Yanagi, Kariya (JP); Atsushi Kasahara, Kariya (JP); Shogo Ikeura, Kariya (JP)

(73) Assignee: DENSO CORPORATION, Kariya (JP)

( * ) Notice: Subject to any disclaimer, the term of this patent is extended or adjusted under 35 U.S.C. 154(b) by 32 days.

(21) Appl. No.: 17/066,743

(22) Filed: Oct. 9, 2020

(65) Prior Publication Data

US 2021/0028277 A1    Jan. 28, 2021

Related U.S. Application Data

(63) Continuation of application No. PCT/JP2019/014979, filed on Apr. 4, 2019.

(30) Foreign Application Priority Data

Apr. 13, 2018  (JP) .............................. JP2018-077820

(51) Int. Cl.
*H01L 29/06* (2006.01)
*H01L 29/66* (2006.01)
(Continued)

(52) U.S. Cl.
CPC .... *H01L 29/0688* (2013.01); *H01L 29/66106* (2013.01); *H01L 29/866* (2013.01);
(Continued)

(58) Field of Classification Search
CPC ............. H01L 27/0016; H01L 27/0296; H01L 27/0251; H01L 27/0255; H01L 27/0288;
(Continued)

(56) References Cited

U.S. PATENT DOCUMENTS 4,405,933 A * 9/1983 Avery ................. H01L 27/0814
257/546
6,075,276 A * 6/2000 Kitamura ............ H01L 27/0255
257/199
(Continued)

FOREIGN PATENT DOCUMENTS

JP      S48-012395 B1    4/1973
JP      S59-115565 A     7/1984
(Continued)

OTHER PUBLICATIONS

Yamaguchi, "Semiconductor device and its manufacturing method", 2003, JP2003-249663, Machine translation by WIPO. (Year: 2003).*

*Primary Examiner* — Natalia A Gondarenko

(74) *Attorney, Agent, or Firm* — Posz Law Group, PLC

(57) ABSTRACT

A semiconductor device includes a semiconductor substrate, an upper diffusion region and a lower diffusion region. The semiconductor substrate has a main surface. The upper diffusion region of a first conductivity type is disposed close to the main surface of the semiconductor device. The lower diffusion region of a second conductivity type is disposed up to a position deeper than the upper diffusion region in a depth direction of the semiconductor substrate from the main surface as a reference, and has a higher impurity concentration than the semiconductor substrate. A diode device is provided by having a PN junction surface at an interface between the upper diffusion region and the lower diffusion region, and the PN junction surface has a curved surface disposed at a portion opposite to the main surface.

8 Claims, 14 Drawing Sheets

(51) Int. Cl.
*H01L 29/866* (2006.01)
*H01L 21/225* (2006.01)
*H01L 21/265* (2006.01)

(52) U.S. Cl.
CPC .... *H01L 21/2253* (2013.01); *H01L 21/26513* (2013.01); *H01L 29/0692* (2013.01)

(58) Field of Classification Search
CPC ............. H01L 27/0705–0738; H01L 27/0802; H01L 27/0623–0635; H01L 27/0647; H01L 27/0652; H01L 27/0664–0676; H01L 27/0711–0727; H01L 27/075–0766; H01L 27/0783; H01L 27/0788; H01L 27/0266; H01L 27/0259; H01L 27/101; H01L 29/4236; H01L 29/42352; H01L 29/66712; H01L 29/66734; H01L 29/66674; H01L 29/66113; H01L 29/66106; H01L 29/0688; H01L 29/866; H01L 29/0692; H01L 29/7808; H01L 29/7821; H01L 29/7801; H01L 29/7802; H01L 29/7834; H01L 21/2253; H01L 21/26513; H01L 29/6603; H01L 29/66037; H01L 29/666128; H01L 29/66136; H01L 29/66204; H01L 27/0814

USPC ....... 257/173, 355, 551, 105, 106, 481, 601, 257/606, 328, E27.016

See application file for complete search history.

(56) References Cited

U.S. PATENT DOCUMENTS

| | | |
|---|---|---|
| 2007/0018283 A1 | 1/2007 | Fujii |
| 2010/0244194 A1 | 9/2010 | Masada et al. |
| 2011/0266650 A1 | 11/2011 | Yamaura |
| 2012/0032305 A1 | 2/2012 | Kitamura |
| 2013/0189832 A1 | 7/2013 | Masada et al. |

FOREIGN PATENT DOCUMENTS

| | | | | |
|---|---|---|---|---|
| JP | H02-003291 A | 1/1990 | | |
| JP | H04-206780 A | 7/1992 | | |
| JP | 2003249663 A | * 9/2003 | ........... H01L 29/866 |
| JP | 2012-038810 A | 2/2012 | | |
| JP | 2014-179560 A | 9/2014 | | |

* cited by examiner

SEMICONDUCTOR DEVICE AND MANUFACTURING METHOD FOR SAME

CROSS REFERENCE TO RELATED APPLICATIONS

The present application is a continuation application of International Patent Application No. PCT/JP2019/014979 filed on Apr. 4, 2019, which designated the U.S. and claims the benefit of priority from Japanese Patent Application No. 2018-077820 filed on Apr. 13, 2018. The entire disclosures of all of the above applications are incorporated herein by reference.

TECHNICAL FIELD

The present disclosure relates to a semiconductor device having a diode device and a method for manufacturing the semiconductor device.

BACKGROUND

A diode device may be adopted for a constant voltage power supply in a semiconductor device. For example, the constant voltage power supply may also be adopted in a monitoring IC or the like of a battery mounted on a vehicle, and a high-precision voltage control may be required for a power supply to the IC or the like.

SUMMARY

The present disclosure describes a semiconductor device including a semiconductor substrate, an upper diffusion region, and a lower diffusion region, and further describes a method for manufacturing the semiconductor device.

BRIEF DESCRIPTION OF DRAWINGS

The present disclosure will become more apparent from the following detailed description made with reference to the accompanying drawings. In the drawings.

DETAILED DESCRIPTION

Figure 1:
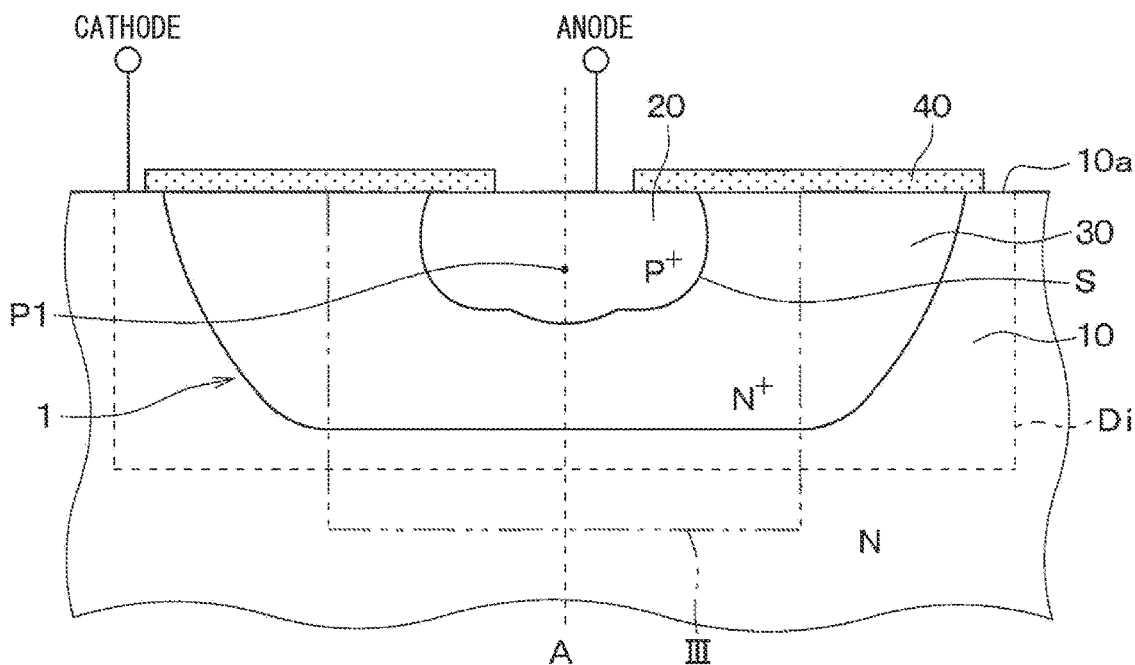
FIG. 1 is a cross-sectional view of a semiconductor device according to a first embodiment.

In some of Zener diode devices, a Zener voltage is determined uniquely depending on concentrations of both an N conductivity type epitaxial layer and a P conductivity type diffusion layer in a PN junction between the N conductivity type epitaxial layer and the P conductivity type diffusion layer.

On the other hand, a first diffusion region and a second diffusion region may provided in a semiconductor substrate, and impurity concentrations of the two diffusion regions in a PN junction may be arbitrarily controlled. Therefore, the impurity concentrations of the diffusion regions may be controlled to obtain a desired Zener characteristic.

The Zener voltage may vary with time due to breakdown. The characteristic fluctuation may be caused by trapping hot carriers generated by a breakdown phenomenon in surface defects of a semiconductor substrate.

In a joint portion where the first diffusion region and the second diffusion region overlap with each other, a breakdown voltage caused by the overlap is lowered. Breakdown may occur in a portion corresponding to the overlap. In the configuration described above, the portion corresponding to the overlap is a three-dimensional region, and the breakdown phenomenon occurs somewhere in the three-dimensional region, but a position of the breakdown phenomenon is indefinite. In other words, an exact location at which the breakdown occurs is not controllable.

Since the generation of hot carriers and a state of trapping the hot carriers into surface defects are different depending on the position where the breakdown occurs, the indefinite position at which the breakdown occurs causes a large amount of fluctuation of the Zener voltage with time. The fluctuation of the Zener voltage with time may hinder the high-precision voltage control.

According to the first aspect of the present disclosure, a semiconductor device includes a semiconductor substrate, an upper diffusion region and a lower diffusion region. A diode device is disposed in the semiconductor device. The semiconductor substrate has a main surface. The upper diffusion region of a first conductivity type is disposed close to the main surface of the semiconductor device. The lower diffusion region of a second conductivity type is disposed up to a position deeper than the upper diffusion region in a depth direction of the semiconductor substrate from the main surface as a reference, and has a higher impurity concentration than the semiconductor substrate. The diode device has a PN junction surface at an interface between the upper diffusion region and the lower diffusion region, and the PN junction surface has a curved surface disposed opposite to the main surface.

Since the PN junction surface of the diode device has a curved surface on a portion opposite to the main surface, a local maximum impurity concentration is provided in the upper diffusion region or the lower diffusion region. Therefore, the position at which the breakdown phenomenon occurs may be limited as compared with the configuration where the breakdown phenomenon occurs three-dimensional manner as in a comparative semiconductor device. Therefore, a fluctuation of the Zener voltage with time may be inhibited.

According to the second aspect of the present disclosure, a method for manufacturing the semiconductor device described above is provided. The method includes: preparing of the semiconductor substrate having the main surface; forming of an upper implantation region of a first conductivity type in the upper diffusion region by ion implantation on the semiconductor substrate; forming of a lower implantation region of a second conductivity type in the lower diffusion region by the ion implantation on the semiconductor substrate; and forming of a diode device including a PN junction surface having a curved surface in a portion opposite to the main surface by diffusing the upper implantation region and the lower implantation region to form the upper diffusion region and the lower diffusion region through annealing.

According to the above configuration, the PN junction surface having the curved surface in the portion opposite to the main surface is provided. Therefore, it is possible to manufacture a semiconductor device in which the fluctuation of the Zener voltage with time is inhibited.

The following describes several embodiments of the present disclosure with reference to the drawings. In the following embodiments, parts which are identical or equivalent to each other will be described with the same reference signs.

First Embodiment

The following describes a semiconductor device according to a first embodiment with reference to the drawings. The semiconductor device according to the present embodiment includes a Zener diode device. For example, the semiconductor device may be disposed in a power supply circuit and adopted as a constant voltage power supply.

Figure 2:
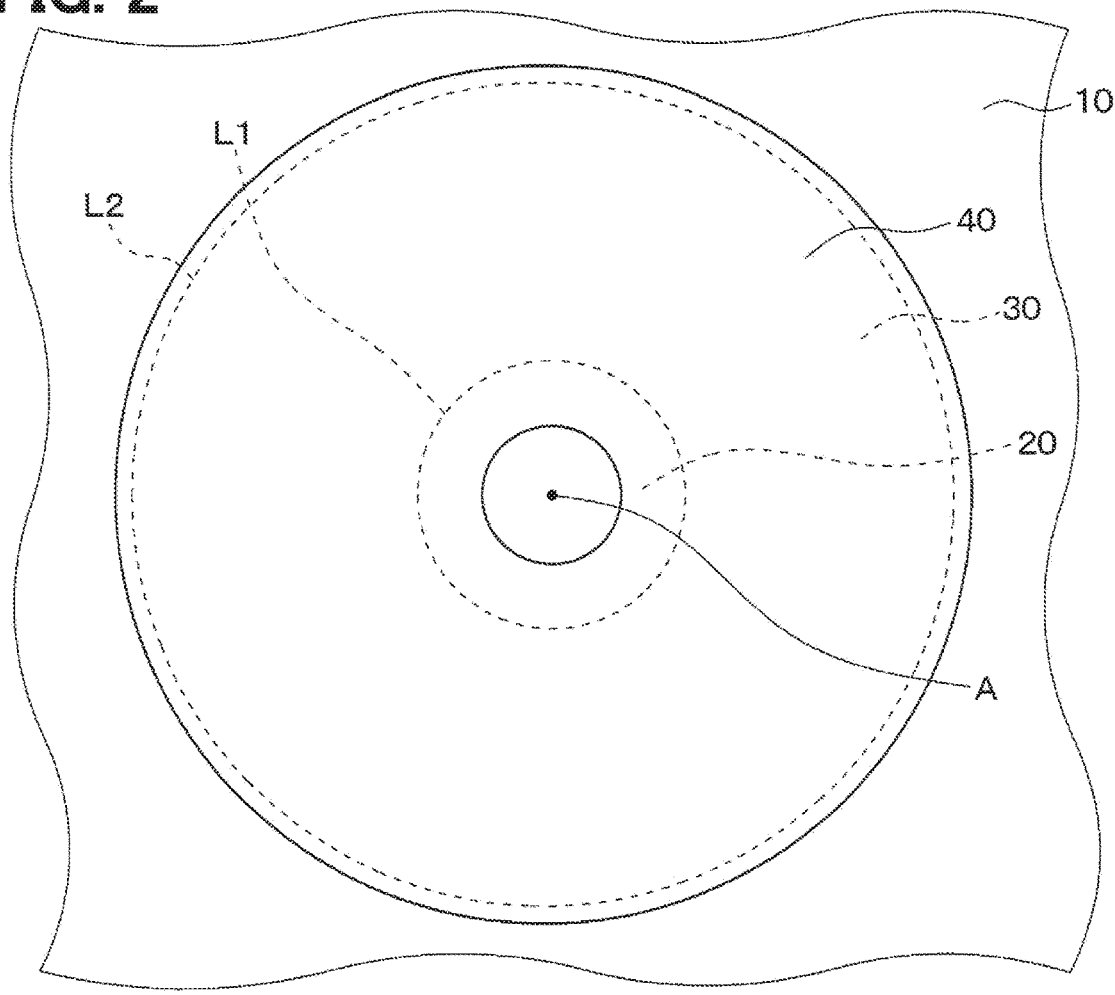
FIG. 2 is a top view of the semiconductor device shown in FIG. 1.

The following describes the configuration of the semiconductor device according to the present embodiment with reference to FIGS. 1 and 2. The semiconductor device includes a semiconductor substrate 10, an upper diffusion region 20, a lower diffusion region 30, and a silicide block layer 40.

The semiconductor substrate 10, in the present embodiment is an N conductivity type, and has a diode region Di on the main surface 10a side. FIG. 1 is a diagram illustrating the diode region Di of the semiconductor device. In the diode region Di, a Zener diode device (hereinafter referred to as a diode device) 1 is formed by formation of the upper diffusion region 20 and the lower diffusion region 30.

The upper diffusion region 20 is provided by diffusing P conductivity type impurities. The upper diffusion region 20 is formed in a surface layer portion of the semiconductor substrate 10 at the main surface 10a side so as to be exposed from the main surface 10a of the semiconductor substrate 10.

The upper diffusion region 20 is formed in a substantially rotational symmetry with respect to an axis A intersecting with the main surface 10a. Specifically, the upper diffusion region 20 according to the present embodiment is formed in a substantially perfect circular shape centered on a point where the axis A and the main surface 10a intersect with each other when viewed from a normal direction to the main surface 10a (hereinafter referred to as a normal direction). The view from the normal direction to the main surface 10a may also be referred to as the normal direction to the main surface 10a. Further, the axis A is an axis that passes through a center of the upper diffusion region 20 when viewed from the normal direction, and extends in a depth direction of the semiconductor substrate 10. In other words, the axis A is an axis that passes through the center of the upper diffusion region 20 when viewed from the normal direction, and extends in a direction perpendicular to the main surface 10a.

A cross-sectional shape passing through the axis A of the upper diffusion region 20 has a structure in which the portion through which the axis A passes is bulged on a side opposite to the main surface 10a. In other words, an outer edge of the upper diffusion region 20 has a structure in which a portion intersecting with the axis A is most distant from the main surface 10a. In other word, the upper diffusion region 20 is configured to have only one point most distant from the main surface 10a. Therefore, the upper diffusion region 20 is formed in a disc shape in which a portion close to the axis A is inflated. In other words, the upper diffusion region 20 is formed in a disc shaped configuration having a curved surface on a portion opposite to the main surface 10a side.

The outer edge of the upper diffusion region 20, in other words, refers to an interface between the upper diffusion region 20 and the lower diffusion region 30. Further, in the present embodiment, since the upper diffusion region 20 is formed substantially rotationally symmetrical with respect to the axis A, the axis A may be referred to as a symmetry axis. Further, in the present embodiment, the upper diffusion region 20 is shaped in a so-called rotating body having a substantially perfect circular shape when viewed from the normal direction, but does not necessarily have to have a perfect circular shape. For example, the upper diffusion region 20 may be n-fold symmetric shape. Specifically, the upper diffusion region 20 may have a shape such as an ellipse or a capsule shape (that is, twice symmetric), an equilateral triangle shape (that is, three times symmetric), a square shape (that is, four times symmetric), or the like when viewed from the normal direction to the main surface 10*a*.

The lower diffusion region 30 is provided by diffusing the impurity of the N conductivity type. The lower diffusion region 30 is formed in a substantially rotational symmetry with respect to the axis A while covering the upper diffusion region 20, in the same manner as that of the upper diffusion region 20. In the present embodiment, the lower diffusion region 30 is formed in a substantially perfect circular shape centered on a point where the axis A intersects with the main surface 10*a* when viewed from the normal direction. Similarly to the upper diffusion region 20, the shape of the lower diffusion region 30 when viewed from the normal direction is not limited to a perfect circular shape, but may be sufficient to be formed n times symmetrically.

The lower diffusion region 30 according to the present embodiment completely covers the upper diffusion region 20, and a part of the upper diffusion region 20 is formed so as to be exposed from the main surface 10*a*. In other word, when viewed from the normal direction, the lower diffusion region 30 is exposed from the main surface 10*a* in a region far from the outer edge of the upper diffusion region 20 with respect to the center. In other word, in the main surface 10*a*, as shown in FIG. 2, the upper diffusion region 20, the lower diffusion region 30, and the semiconductor substrate 10 are formed by spreading concentrically in a stated order, with a point at which the axis A and the main surface 10*a* intersect with each other as a center.

The lower diffusion region 30 according to the present embodiment is provided to have a substantially parallel portion to the main surface 10*a* in the portion opposite to the main surface 10*a*. In other words, the outer edge of the lower diffusion region 30 has a portion extending along a plane direction of the main surface 10*a* in a portion opposite to the main surface. The outer edge of the lower diffusion region 30 means a boundary between the lower diffusion region 30 and a semiconductor region of the semiconductor substrate 10 where the lower diffusion region 30 or the like is not formed.

The upper diffusion region 20 and the lower diffusion region 30 are formed to provide the diode device 1 by the upper diffusion region 20 of the P conductivity type and the lower diffusion region 30 of the N conductivity type. In other words, the diode device 1 in which the upper diffusion region 20 functions as an anode, and the lower diffusion region 30 functions as a cathode is provided.

In the diode device 1, a PN junction surface S is formed between the upper diffusion region 20 of the P conductivity type and the lower diffusion region 30 of the N conductivity type. In other words, the PN junction surface S extends along the outer edge of the upper diffusion region 20. Therefore, the PN junction surface S is provided to have a curved surface on a portion opposite to the main surface 10*a*. In the present embodiment, in the PN junction surface S, a portion most distant from the main surface 10*a* is a curved surface, and a portion of the upper diffusion region 20, which intersects with the axis A, is a convex shape most remote from the main surface 10*a*.

The silicide block layer 40 is formed on the main surface 10*a* of the semiconductor substrate 10, and is formed of an insulating film such as an oxide film (that is, $SiO_2$). The silicide block layer 40 according to the present embodiment is formed in a toric shape or an annular shape with an intersection of the axis A and the main surface 10*a* as a center.

In the present embodiment, as described above, the upper diffusion region 20 and the lower diffusion region 30 are exposed to the main surface 10*a*, and a semiconductor region of the semiconductor substrate 10 is exposed to the outside of the lower diffusion region 30. The silicide block layer 40 is formed so as to cover a surface extending to the semiconductor region of the semiconductor substrate 10 through the lower diffusion region 30 from the outer edge of the upper diffusion region 20. In other word, the silicide block layer 40 is formed so as to extend across a PN junction line L1 of the upper diffusion region 20 of the P conductivity type and the lower diffusion region 30 of the N conductivity type, which are exposed from the main surface 10*a*, and a boundary line L2 between the lower diffusion region 30 and the semiconductor substrate 10.

The silicide block layer 40 is formed for the purpose of maintaining an electrical insulation between the upper diffusion region 20 and the lower diffusion region 30 or the semiconductor substrate 10, for example, when forming the silicide block layer 40 by laminating a silicide electrode containing cobalt on the main surface 10*a*.

The semiconductor device according to the present embodiment is described above. An impurity concentration profile of the diode device 1 according to the present embodiment will be described in detail with reference to FIG. 3.

Figure 3:
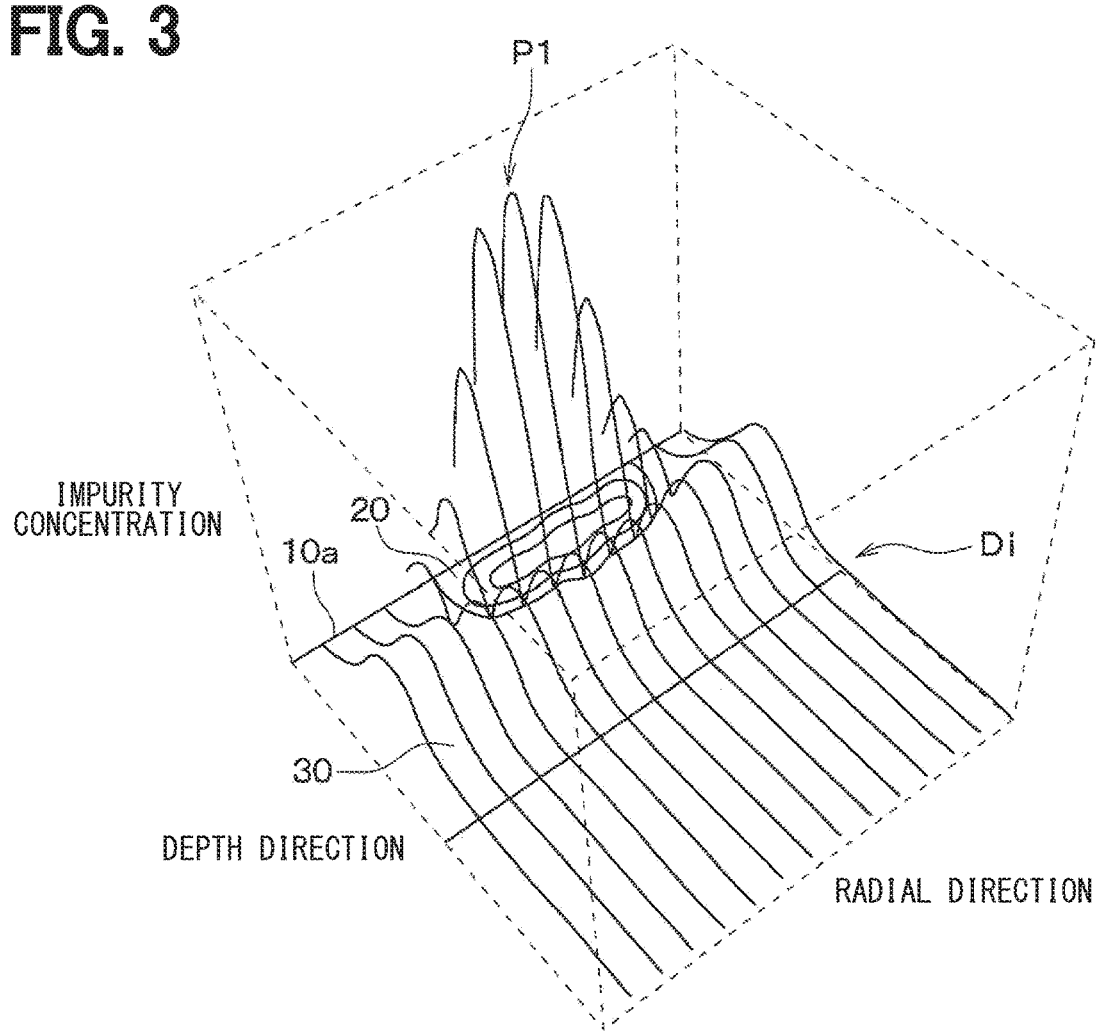
FIG. 3 is a diagram showing a three-dimensional profile of an impurity concentration in a region III in FIG. 1.

In the present embodiment, as described above, since the upper diffusion region 20 and the lower diffusion region 30 are formed substantially rotationally symmetrical with respect to the axis A, the impurity concentration profile in the diode device 1 is substantially rotationally symmetrical with respect to the axis A. As shown in FIG. 3, the diode device 1 is provided to have a local maximum P1 in the upper diffusion region 20 in the impurity concentration profile. The diode device 1 is a portion located on the axis A in the impurity concentration profile, which is a portion located above the PN junction surface S, and is provided to have only the local maximum P1 at a position of the interior distant from the main surface 10*a*.

The upper diffusion region 20 and the lower diffusion region 30 are each formed by diffusing impurities. The PN junction surface S has a curved surface on a portion most distant from the main surface 10*a*. Therefore, in the impurity concentration profile, the local maximum P1 is provided in the upper diffusion region 20.

In this example, in the PN junction Zener diode device, when a reverse bias is applied, a breakdown phenomenon is likely to occur due to an increase in an electric field between portions higher in the impurity concentration of the N conductivity type region and the P conductivity type region. Further, it is inferred that a reason why the amount of fluctuation of the Zener voltage with time is increased is that the occurrence of the breakdown phenomenon is indefinite because generation sources of the breakdown phenomenon are distributed three-dimensional manner.

In the semiconductor device according to the present embodiment, a portion of the high impurity concentration in the upper diffusion region 20 of the P conductivity type (that is, the local maximum P1) is not distributed in a three-dimensional manner, but is defined as 0 dimension (that is, points). Therefore, in the semiconductor device according to the present embodiment, a portion where a breakdown phenomenon occurs may be identified as a point. In other word, the breakdown phenomenon in the semiconductor device according to the present embodiment, the position at which the breakdown phenomenon occurs may be fixed at a substantially predetermined position (that is, the local maximum P1). Therefore, in the semiconductor device according to the present embodiment, when compared with the configuration where the breakdown phenomenon occurs in a three-dimensional manner, the occurrence position of the breakdown phenomenon may be limited. As a result, the occurrence of hot carriers and the state of trapping the hot carriers into the surface defects may be inhibited from being different.

Further, since the occurrence position of the breakdown phenomenon may be limited, the state in which the crystal defects are mixed in the position where the breakdown phenomenon occurs may be inhibited. In other words, the Zener voltage may be inhibited from being changed by the crystal defects.

Figure 4:
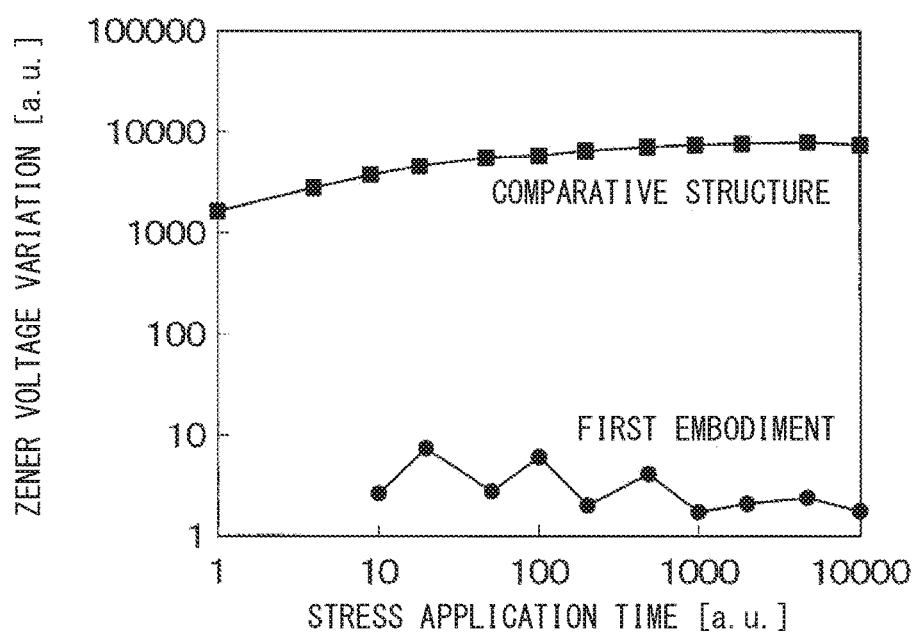
FIG. 4 is a diagram showing a variation in the amount of fluctuation of the Zener voltage with time.

As described above, according to the semiconductor device of the present embodiment, as shown in FIG. 4, the fluctuation of the Zener voltage over time may be inhibited as compared with a comparative semiconductor device. For example, the diode device 1 included in the semiconductor device according to the present embodiment is adopted in the constant voltage power supply, thereby being capable of controlling the output voltage with high accuracy regardless of the time lapse.

The configuration of the semiconductor device according to the present embodiment is described above. Next, a method for manufacturing the semiconductor device described above will be described with reference to FIGS. 5A to 5D and FIG. 2.

Figure 5A:
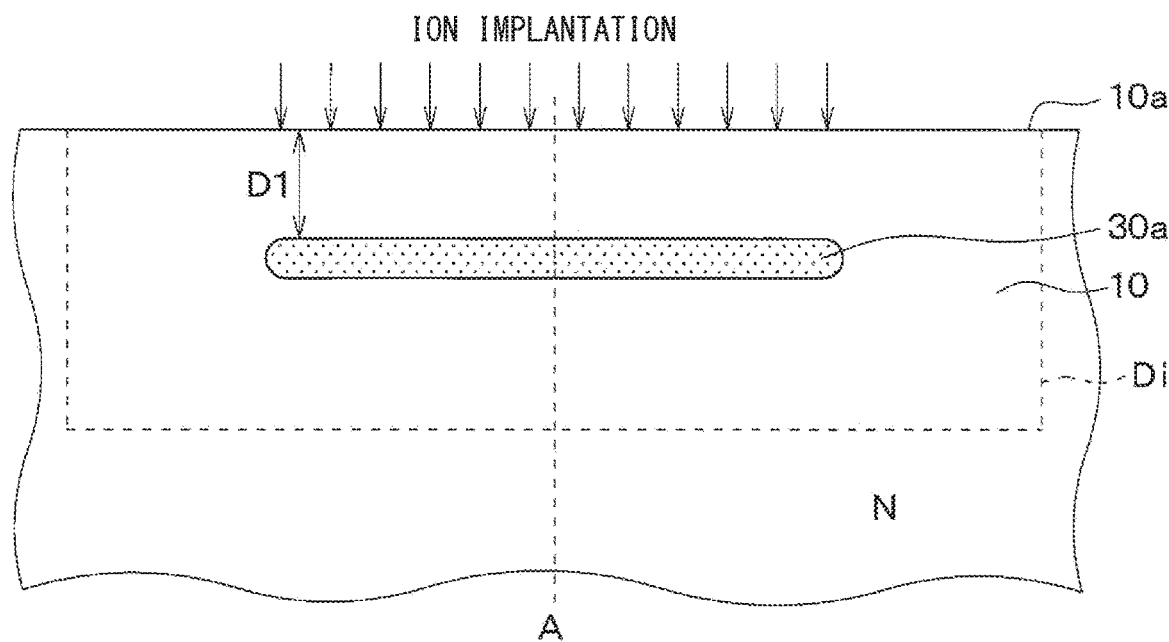
FIG. 5A is a cross-sectional view showing a process of manufacturing the semiconductor device shown in FIG. 1.

As shown in FIG. 5A, a semiconductor substrate 10 of an N conductivity type is prepared. Then, a photoresist (not shown) is placed on a main surface 10a, and the photoresist is patterned so as to provide a perfect circular opening.

Next, with the use of the photoresist as a mask, ions of an impurity such as phosphorus or arsenic are implanted to form a lower implantation region 30a of the N conductivity type. At this time, since the opening of the photoresist has a perfect circular shape, the lower implantation region 30a is formed in a disc shape with the axis A as the center. Thereafter, the photoresist is removed by ashing or the like.

In the ion implantation according to the present embodiment, the dose amount is about $1 \times 10^{14}$ cm$^{-2}$ to $1 \times 10^{15}$ cm$^{-2}$. The ion implantation is performed at the same energy for each portion of the main surface 10a so that the implantation depth of the lower implantation region 30a is kept substantially constant. In the present embodiment, a lower implantation region 30a is formed to a first depth D1 distant from the main surface 10a by a predetermined distance in a depth direction of the semiconductor substrate 10.

The lower implantation region 30a is a region before being diffused by annealing, and becomes the lower diffusion region 30 by annealing. Further, a diameter of the opening provided in the photoresist is defined so that when the lower diffusion region 30 is formed from the lower implantation region 30a by performing annealing, a portion opposite to the main surface 10a in the lower diffusion region 30 has a substantially parallel portion with the main surface 10a.

Figure 5B:
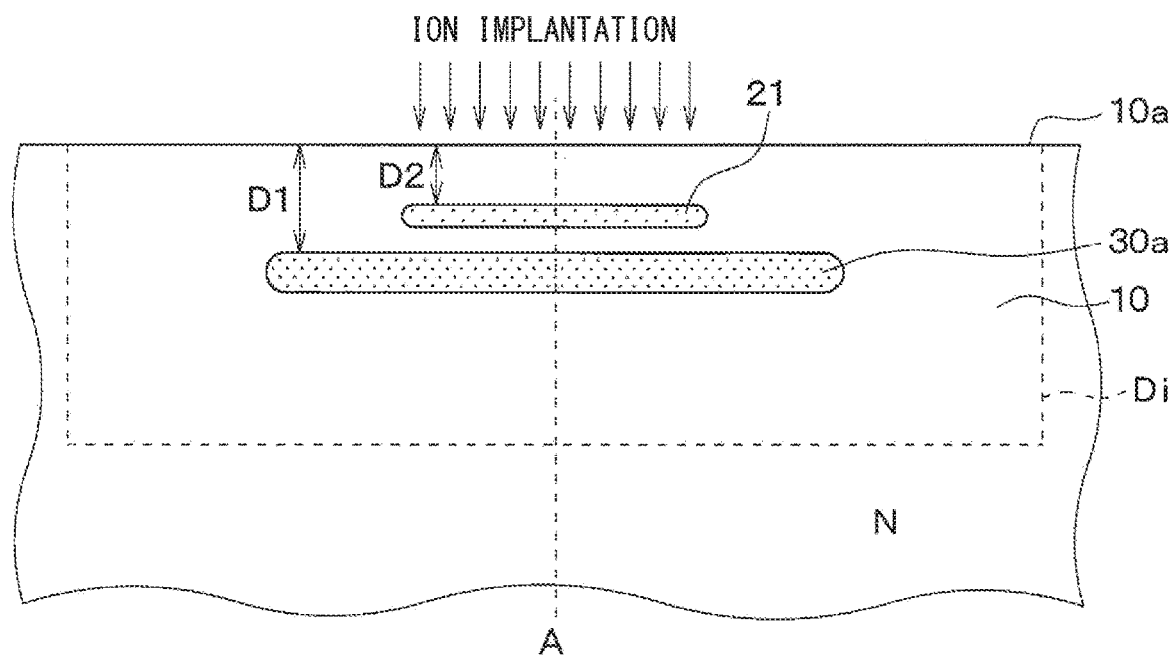
FIG. 5B is a cross-sectional view showing a process of manufacturing the semiconductor device subsequent to FIG. 5A.

As shown in FIG. 5B, a first upper implantation region 21 is formed in the semiconductor substrate 10. A photoresist (not shown) is placed again on the main surface 10a to pattern the photoresist. In patterning the photoresist, the photoresist is patterned so that an opening having the same center as that of the lower implantation region 30a and having a perfect circular shape smaller than the lower implantation region 30a is provided.

With the use of the photoresist as a mask, ions of an impurity such as boron are implanted to form the first upper implantation region 21. At this time, since the opening of the photoresist is formed in a perfect circular shape, the first upper implantation region 21 is formed in a disc shape around the axis A. Thereafter, the photoresist is removed by ashing or the like.

Figure 5C:
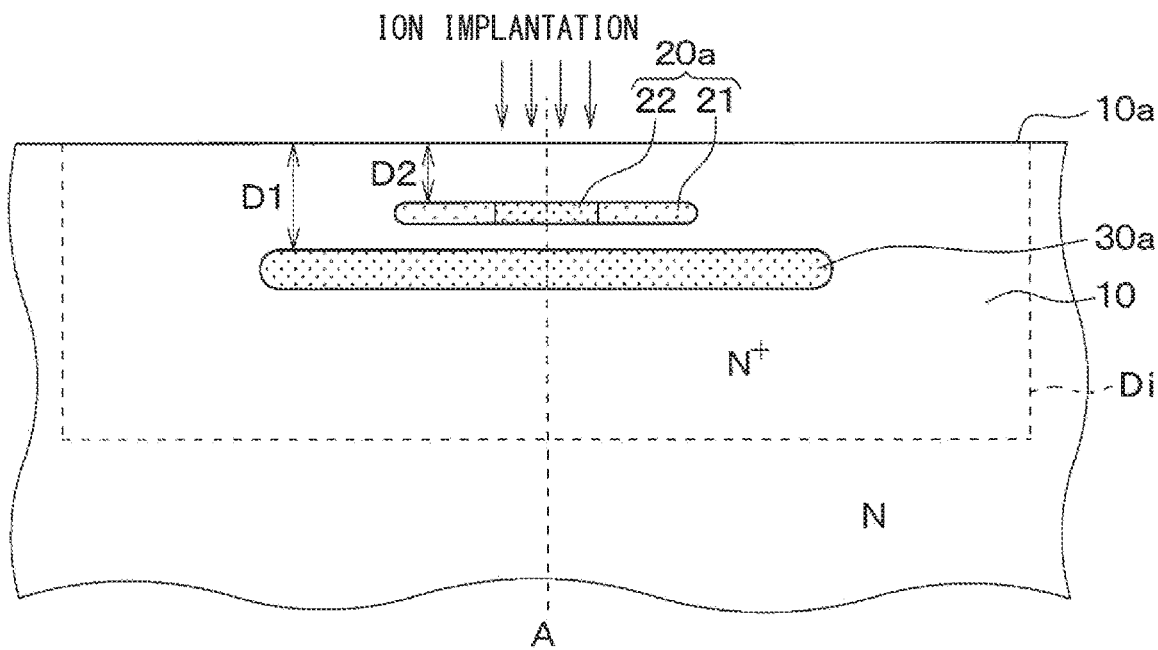
FIG. 5C is a cross-sectional view showing a process of manufacturing the semiconductor device subsequent to FIG. 5B.

In the ion implantation, during a process of FIG. 5C, the dose amount is adjusted in conjunction with the process of FIG. 5C so that the dose amount of a second upper implantation region 22 is $1 \times 10^{14}$ to $1 \times 10^{15}$ cm$^{-2}$. The ion implantation is performed at the same energy for each portion of the main surface 10a so that the implantation depth of the first upper implantation region 21 is kept substantially constant. In the present embodiment, the first upper implantation region 21 is formed at a second depth D2 which is shallower than the first depth D1 and which is separated from the main surface 10a by a predetermined distance in the depth direction of the semiconductor substrate 10.

The first upper implantation region 21 is a region before being diffused by annealing. After annealing, the first upper implantation region 21 is a region which becomes an upper diffusion region 20 together with the second upper implantation region 22. The second depth D2 is shallower than the first depth D1, but when annealing is performed, a peak exists at a position deeper than a portion exposed from the main surface 10a in the impurity concentration in the upper diffusion region 20.

As shown in FIG. 5C, the second upper implantation region 22 is formed in the semiconductor substrate 10 to form an upper implantation region 20a. The photoresist is placed again on the main surface 10a, and the photoresist is patterned. When the photoresist is patterned, a perfect circular opening having the same center as that of the first upper implantation region 21 and having a diameter smaller than that of the first upper implantation region 21 is formed. With the use of the photoresist as a mask, ions of an impurity such as boron are again implanted to form the second upper implantation region 22. At this time, since the opening of the photoresist is formed in a perfect circular shape, the second upper implantation region 22 is formed in a disc shape around the axis A. Thereafter, the photoresist (not shown) is removed by ashing or the like.

This ion implantation is performed at an energy equal to the energy used to form the first upper implantation region 21, so that the second upper implantation region 22 has the same depth as that of the first upper implantation region 21. The second upper implantation region 22 is formed in the first upper implantation region 21. In the ion implantation, the dose amount of the second upper implantation region 22 is adjusted to about $1 \times 10^{14}$ cm$^{-2}$ to $1 \times 10^{15}$ cm$^{-2}$ in conjunction with the process in FIG. 5B.

The second upper implantation region 22 is a region before diffusion by annealing. After annealing, the second upper implantation region 22 is a region which becomes the upper diffusion region 20 together with the first upper implantation region 21. In other word, the processes of FIGS. 5B and 5C are performed to form the upper implantation region 20a to be the upper diffusion region 20 by annealing.

Figure 5D:
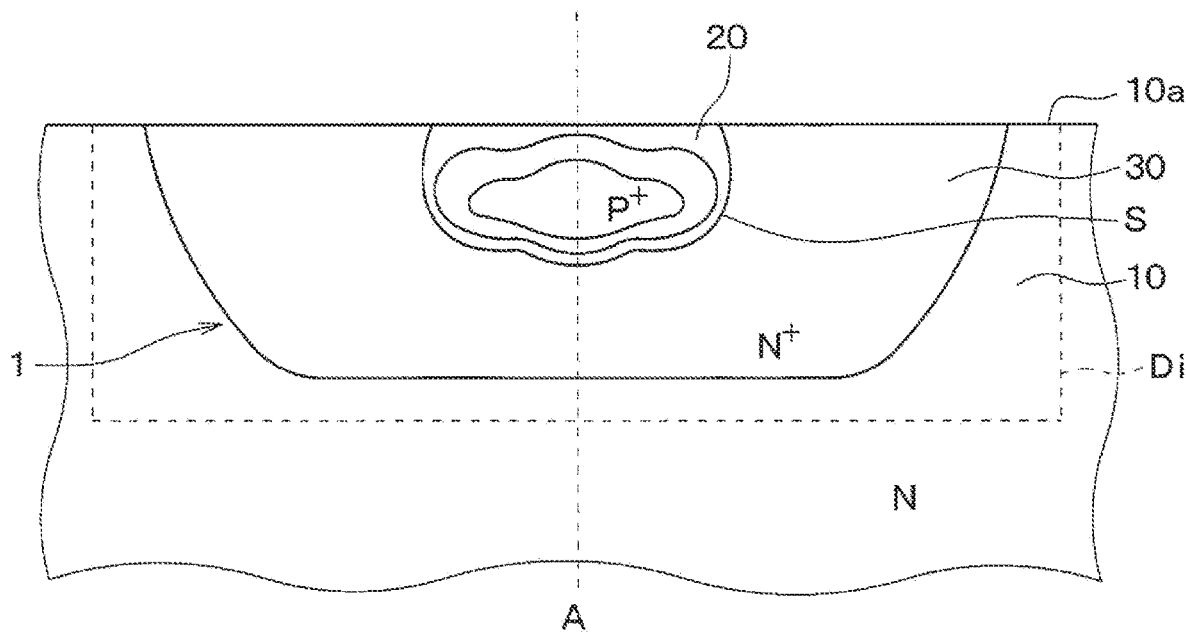
FIG. 5D is a cross-sectional view showing a process of manufacturing the semiconductor device subsequent to FIG. 5C.

As shown in FIG. 5D, annealing is performed to thermally diffuse the lower implantation region 30a to form the lower diffusion region 30, and the upper implantation region 20a having the first upper implantation region 21 and the second upper implantation region 22 is thermally diffused to form the upper diffusion region 20. At this time, since the lower implantation region 30a and the upper implantation region 20a are formed on the disc having the same center, the upper diffusion region 20 and the lower diffusion region 30 are formed substantially rotationally symmetrical with respect to the axis A.

Since the first upper implantation region 21 and the second upper implantation region 22 are formed, the dose amount of the second upper implantation region 22 is increased in the upper implantation region 20a. In the upper implantation region 20a, there is a portion having the largest dose amount on the axis A. When the upper implantation region 20a is thermally diffused to form the upper diffusion region 20, the upper diffusion region 20 has a peak of the impurity concentration existing on the axis A.

At an interface between the upper diffusion region 20 and the lower diffusion region 30 in the portion on the axis A, a portion of the upper diffusion region 20, which is highest in the impurity concentration is present on the axis A, so that the upper diffusion region 20 is likely to diffuse as compared with the other portions of the interface. In other words, at the interface between the upper diffusion region 20 and the lower diffusion region 30 in the portion on the axis A, as compared with the other portions of the interface, the lower diffusion region 30 is less likely to diffuse.

At the interface between the upper diffusion region 20 and the lower diffusion region 30, a portion intersecting with the axis A bulge on the side opposite to the main surface 10a. In the upper diffusion region 20, a portion of the outer edge intersecting with the axis A is most distant from the main surface 10a. The upper diffusion region 20 has a configuration in which a portion located below the portion where the second upper implantation region 22 is formed is most distant from the main surface 10a. The PN junction surface S mainly of a portion of the upper diffusion region 20 intersecting with the axis A is a convex shape most distant from the main surface 10a. The upper diffusion region 20 and the lower diffusion region 30 are provided such that a portion having a local maximum P1 of the impurity concentration is formed in the upper diffusion region 20.

As described above, since the upper implantation region 20a is formed at the second depth D2 apart by a predetermined distance from the main surface 10a, the upper diffusion region 20 has the local maximum P1 at a position apart by a predetermined distance from the main surface 10a.

In FIG. 5D, a contour line shown in the upper diffusion region 20 indicates a contour line of the impurity concentration, and indicates that the peak of the impurity concentration in the upper diffusion region 20 is located on the axis A.

Although not particularly shown, a silicide block layer 40 is formed so as to extend across a PN junction line L1 of the P conductivity type upper diffusion region 20 and the N conductivity type lower diffusion region 30 exposed from the main surface 10a, and a boundary line L2 between the lower diffusion region 30 and the semiconductor substrate 10. The semiconductor device according to the present embodiment is manufactured in the manner described above.

The diode device 1 is provided to have the local maximum P1 in the upper diffusion region 20 in the impurity concentration profile. Therefore, the position at which the breakdown phenomenon occurs may be limited as compared with the configuration where the breakdown phenomenon occurs in a three dimensional manner as in a comparative semiconductor device. Further, since the occurrence position of the breakdown phenomenon may be limited, the crystal defects may be inhibited from being mixed in the position where the breakdown phenomenon occurs, and the output voltage may be inhibited from being changed by the crystal defects. Therefore, the fluctuation of the Zener voltage over time may be inhibited as compared with the comparative semiconductor device.

The local maximum P1 of the upper diffusion region 20 is formed within a predetermined distance from the main surface 10a. For that reason, as compared with the situation in which the local maximum P1 of the upper diffusion region 20 is formed on the main surface 10a, the hot carriers may be inhibited from being trapped to the level caused by the surface defects present in the vicinity of the main surface 10a, and the amount of fluctuation of the Zener voltage with time may be further inhibited.

In the semiconductor device according to the present embodiment, when viewed from the normal direction, the upper diffusion region 20 and the lower diffusion region 30 are formed in a rotationally symmetrical shape, in particular, a perfect circular shape. According to the above configuration, the local maximum P1 of the impurity concentration in the upper diffusion region 20 may be formed on the rotation symmetry axis (the axis A in the present embodiment), and the local maximum P1 may be easily formed in a point shape.

The lower diffusion region 30 is formed so as to cover the upper diffusion region 20, and is exposed from the main surface 10a. For that reason, as compared with the situation in which the lower diffusion region 30 is not exposed to the main surface, the depletion layer formed between the P conductivity type upper diffusion region 20 and the N conductivity type region in the surface layer of the main surface 10a may be inhibited from spreading. Therefore, it may be possible for the hot carriers to be inhibited from being trapped to the level caused by the surface defects present in the vicinity of the main surface 10a, and it may also be possible to further inhibit the amount of fluctuation of the Zener voltage with time.

In the present embodiment, the silicide block layer 40 is provided on the main surface 10a. The silicide block layer 40 is formed so as to extend across the PN junction line L1 between the upper diffusion region 20 and the lower diffusion region 30, and so as to extend across the boundary line L2 between the lower diffusion region 30 and the semiconductor region in the semiconductor substrate 10. When the silicide electrode is laminated on the main surface 10a, an electrical conduction by silicide may be inhibited from occurring between the P conductivity type upper diffusion region 20 and the N conductivity type lower diffusion region 30 or the semiconductor substrate 10.

In the present embodiment, since the lower implantation region 30a and the upper implantation region 20a are formed, and the lower diffusion region 30 and the upper diffusion region 20 are simultaneously formed by annealing, annealing may be performed once. The diffusion distance of the impurity becomes shorter as compared with the situation where annealing is performed multiple times. As compared with the situation in which annealing is performed multiple times, the dose amount for setting the impurity concentration to a desired value may be reduced, and crystal defects that may be generated at the time of ion implantation may be reduced.

Second Embodiment

The following describes a second embodiment. In the present embodiment, the configuration of the upper diffusion region 20 is changed from that in the first embodiment. The other configurations are the same as those of the first embodiment, and therefore a description of the similar configurations will not be described.

Figure 6:
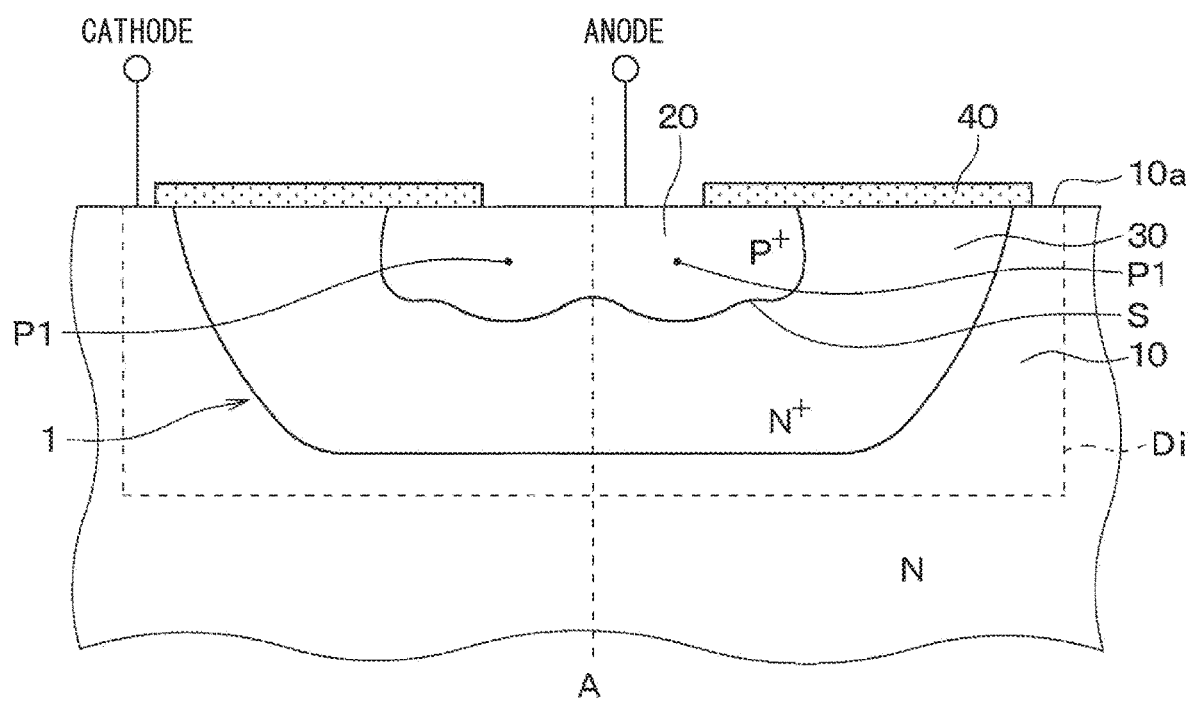
FIG. 6 is a cross-sectional view of a semiconductor device according to a second embodiment.

As shown in FIG. 6, in a cross-sectional shape passing through an axis A of an upper diffusion region 20, a portion through which the axis A passes is recessed from the periphery. In the cross-sectional shape passing through the axis A of the upper diffusion region 20, a portion located around the axis A is most distant from a main surface 10a. In other word, at an outer edge of the upper diffusion region 20, a portion located around the axis A is most distant from the main surface 10a, and the portion is a curved surface. At a PN junction surface S, a portion intersecting with the axis A has a concave shape, and a portion located around the portion intersecting with the axis A has a convex shape.

In a diode device 1 described above, in the impurity concentration profile, a local maximum P1 is formed above a portion of the upper diffusion region 20, which is most distant from the main surface 10a of the PN junction surface S. In practice, since the upper diffusion region 20 and the lower diffusion region 30 are substantially formed in a disc shape, the local maximum P1 is also a part of a circle having an axis A as a symmetry axis. In other word, the local maximum P1 of the upper diffusion region 20 in the present embodiment has a shape which is distributed in one-dimensional manner around the axis A (specifically circular).

The following describes a method for manufacturing the semiconductor device according to the present embodiment.

Figure 7:
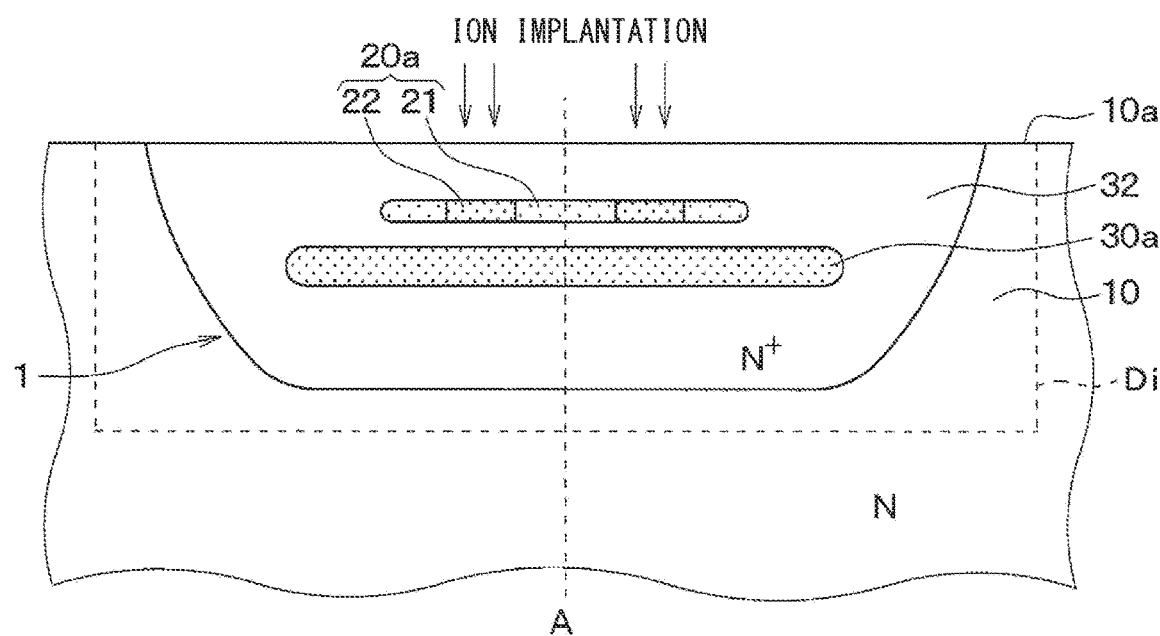
FIG. 7 is a cross-sectional view showing a method for manufacturing the semiconductor device shown in FIG. 6.

The semiconductor device according to the present embodiment is manufactured by changing a position of a second upper implantation region 22 in FIG. 5C after the process of FIG. 5B. In other word, when forming the second upper implantation region 22 after performing the process of FIG. 5B, as shown in FIG. 7, the second upper implantation region 22 may be formed in a toric shape or an annular shape about the axis A. As a result, the process of FIG. 5D is then performed, to thereby configure the upper diffusion region 20 in which the portion located around the axis A is an outer edge most distant from the main surface 10a. The second upper implantation region 22 of FIG. 7 is formed by changing the patterning of the photoresist serving as a mask.

The diode device 1 according to the present embodiment is provided such that a local maximum P1 is one-dimensional manner distributed in the upper diffusion region 20 in the impurity concentration profile. In the present embodiment, a position at which a breakdown phenomenon occurs may be defined as a line. When compared with the configuration in which the breakdown phenomenon occurs three-dimensional manner as in the comparative semiconductor device, the position at which the breakdown phenomenon occurs may be limited, and the same effects as those in the first embodiment may be obtained.

Third Embodiment

The following describes a third embodiment. In the present embodiment, a local maximum of an impurity concentration is present in a lower diffusion region 30 as compared with the first embodiment. The other configurations are the same as those of the first embodiment, and therefore a description of the same configurations will not be described in the following.

Figure 8:
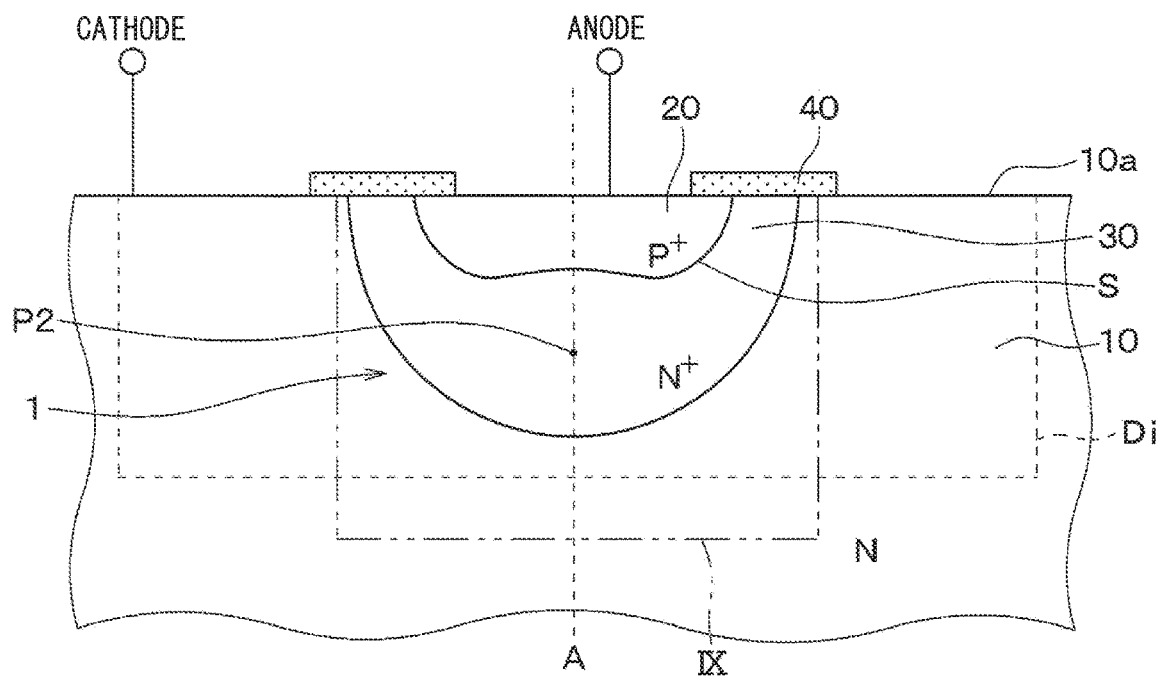
FIG. 8 is a cross-sectional view of a semiconductor device according to a third embodiment.

In the present embodiment, as shown in FIG. 8, in a cross-sectional shape passing through an axis A of an upper diffusion region 20, a portion through which the axis A passes has a recessed structure than the periphery. Further, in a cross-sectional shape passing through the axis A of a lower diffusion region 30, a portion most distant from a main surface 10a is a curved surface. In other words, the cross-sectional shape passing through the axis A of the lower diffusion region 30 is semicircular. In other words, the lower diffusion region 30 is configured to have no portion which is substantially parallel to the main surface 10a in a portion opposite to the main surface 10a. In the PN junction surface S, a portion intersecting with the axis A is a concave shape recessed on the main surface 10a side. In other words, the PN junction surface S is configured to have a curved surface in a portion opposite to the main surface 10a side.

In an outer edge in the upper diffusion region 20, a portion located around the axis A has a configuration most distant from the main surface 10a, similar to the configuration of the upper diffusion region 20 according to the second embodiment. However, in the upper diffusion region 20 according to the present embodiment, as compared with the upper diffusion region 20 according to the second embodiment, the bulging of the portion located around the axis A is made in a gradual manner or gentle.

Figure 9:
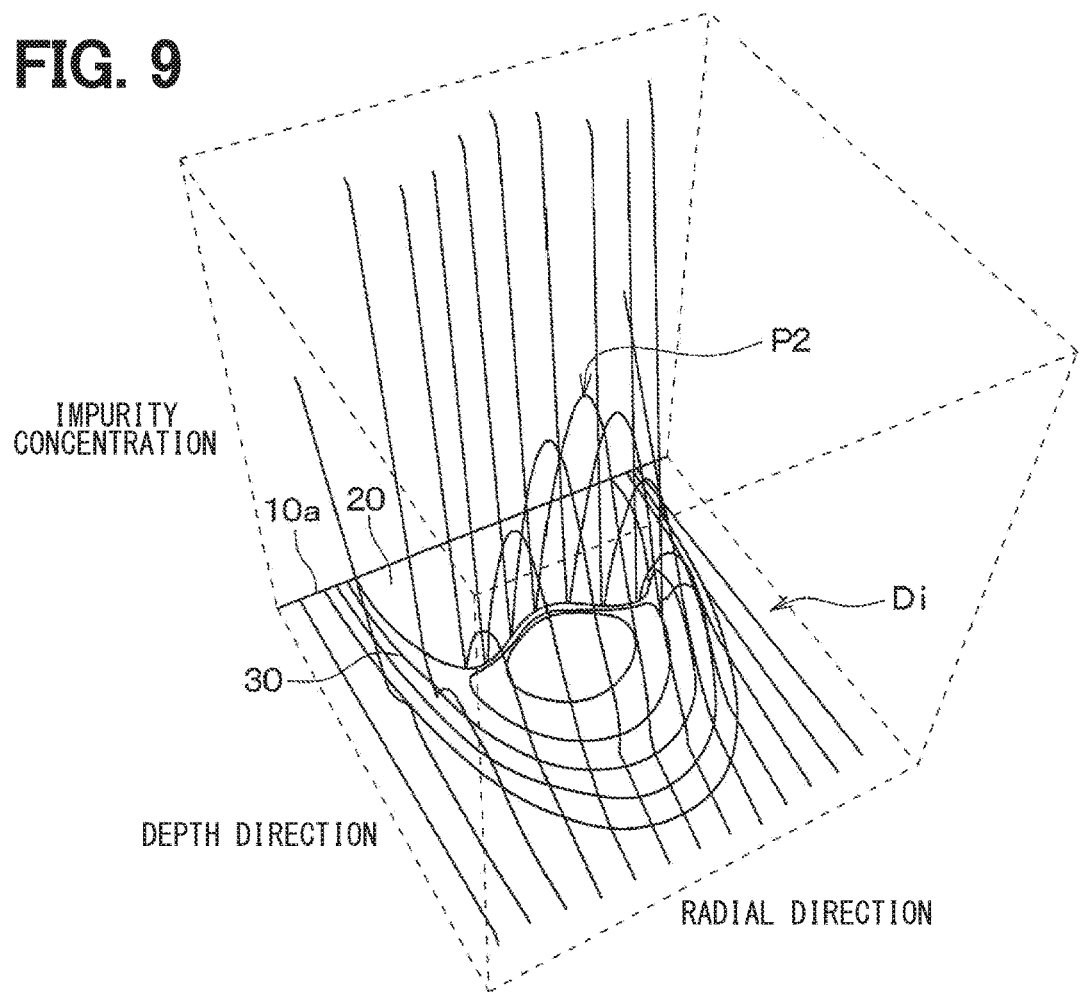
FIG. 9 is a diagram showing a three-dimensional profile of an impurity concentration in a region IX in FIG. 8.

In the diode device 1 described above, as shown in FIG. 9, in the impurity concentration profile, a local maximum P2 is formed in the lower diffusion region 30. In the diode device 1, only a local maximum P2 is formed below the PN junction surface S on the axis A in the impurity concentration profile.

The semiconductor device according to the present embodiment is described above. The following describes a method for manufacturing the semiconductor device with reference to FIGS. 10A to 10D.

Figure 10A:
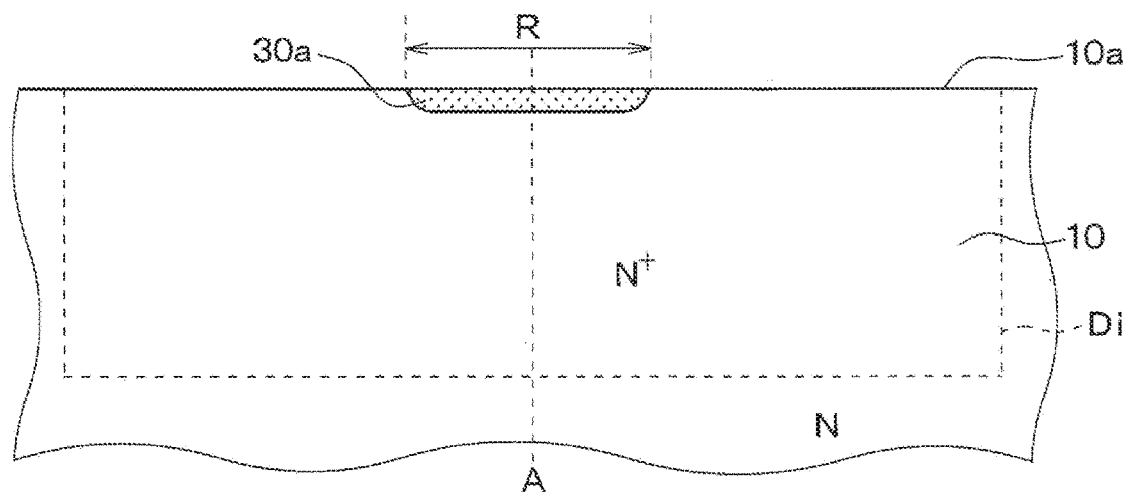
FIG. 10A is a cross-sectional view showing a process of manufacturing the semiconductor device shown in FIG. 8.

As shown in FIG. 10A, a semiconductor substrate 10 of an N conductivity type is prepared. Then, a photoresist (not shown) is placed on a main surface 10a, and the photoresist is patterned so as to provide a perfect circular opening.

With the use of the photoresist as a mask, ions of an impurity such as phosphorus or arsenic are implanted to form a lower implantation region 30a of the N conductivity type. In the ion implantation, an energy is set so that the lower implantation region 30a is formed closer to the main surface 10a than that in the process in FIG. 5A described in the first embodiment. In addition, in the ion implantation, the dose amount is $1\times10^{15}$ cm$^{-2}$ or more. In other word, the ion implantation is performed so that the dose amount is larger than that of the first embodiment. Thereafter, the photoresist is removed by ashing or the like. In the present embodiment, a photoresist is patterned so that a diameter of the lower implantation region 30a becomes R.

Figure 10B:
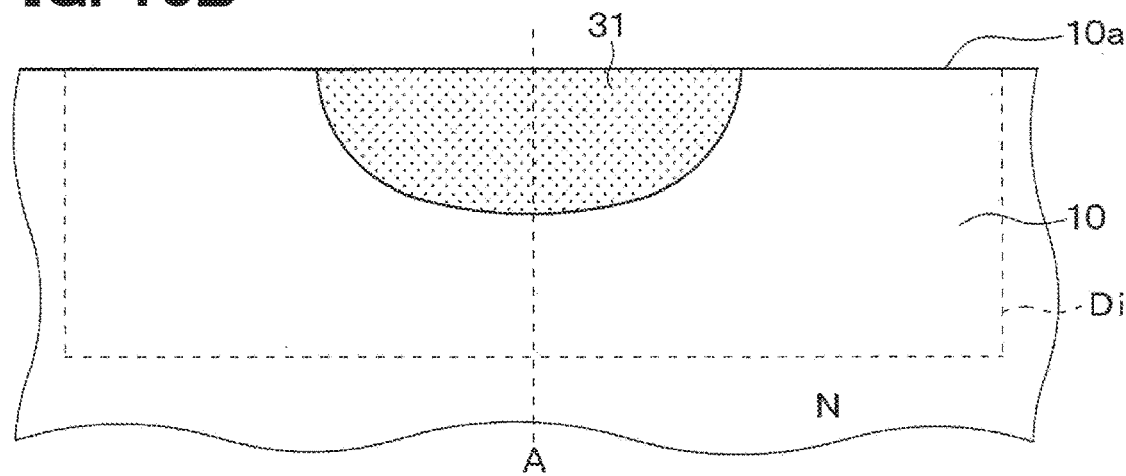
FIG. 10B is a cross-sectional view showing a process of manufacturing the semiconductor device subsequent to FIG. 10A.

As shown in FIG. 10B, a first annealing is performed to diffuse the lower implantation region 30a to form a lower impurity region 31. The lower impurity region 31 is a region which becomes the lower diffusion region 30 by performing a second annealing, and is smaller than the lower diffusion region 30. In the first annealing, a temperature and a time are set so that the lower implantation region 30a does not diffuse until the lower implantation region 30a becomes the lower diffusion region 30.

Figure 10C:
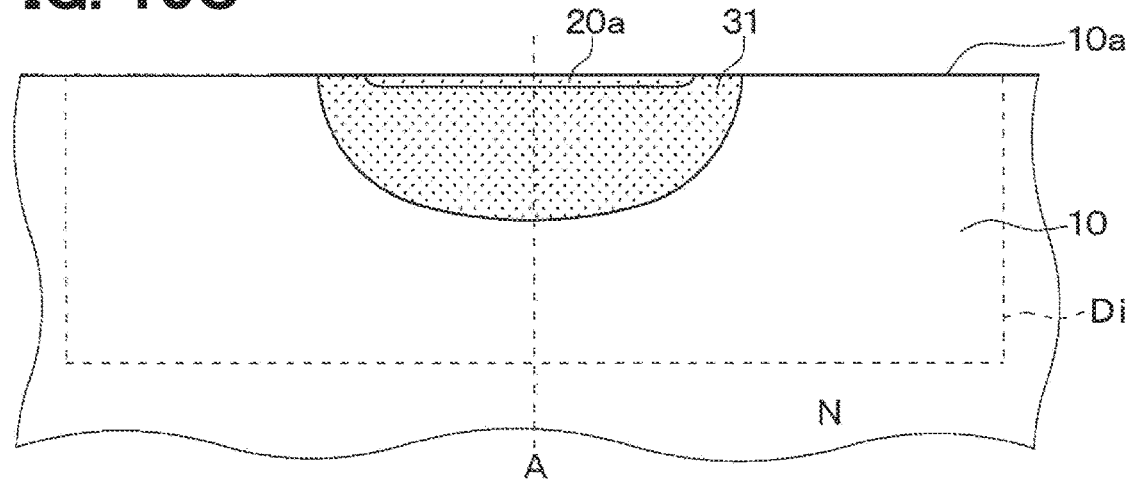
FIG. 10C is a cross-sectional view showing a process of manufacturing the semiconductor device subsequent to FIG. 10B.

As shown in FIG. 10C, an upper implantation region 20a is formed in the lower impurity region 31. A photoresist (not shown) is placed again on the main surface 10a to pattern the photoresist. When the photoresist is patterned, an opening having the same center as that of the lower implantation region 30a and having a perfect circular shape smaller in diameter than that of the lower impurity region 31 is provided.

With the use of the photoresist as a mask, an upper implantation region 20a is formed. As a result, the upper implantation region 20a surrounded by the lower impurity region 31 is formed. In the ion implantation, an energy is set so that the upper implantation region 20a is formed closer to the main surface 10a than that in the process in FIG. 5B described in the first embodiment. In addition, in the ion implantation, the dose amount is $1 \times 10^{15}$ cm$^{-2}$ or more. In other word, the ion implantation is performed so that the dose amount is larger than that of the first embodiment. Thereafter, the photoresist is removed by ashing or the like.

Figure 10D:
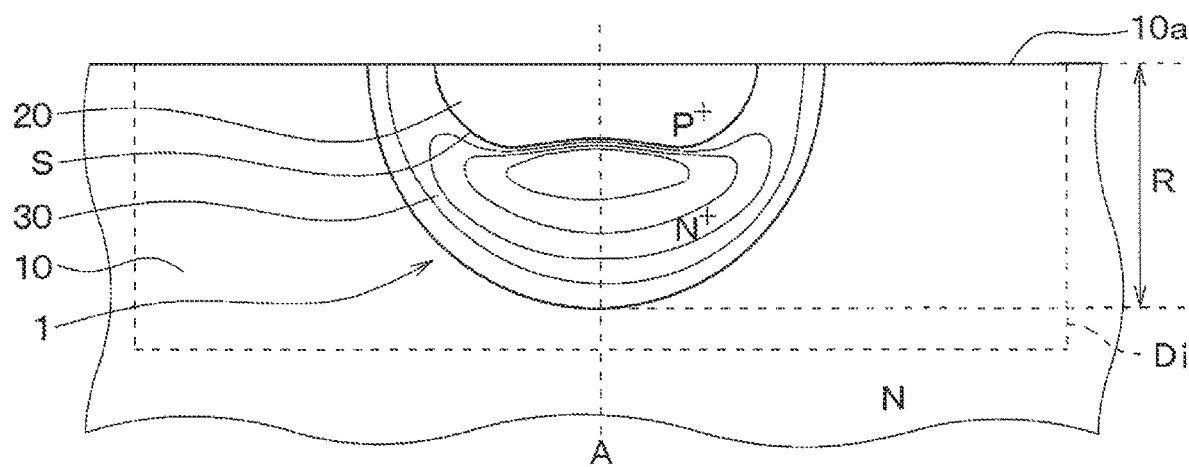
FIG. 10D is a cross-sectional view showing a process of manufacturing the semiconductor device subsequent to FIG. 10C.

As shown in FIG. 10D, a second annealing is performed to thermally diffuse the upper implantation region 20a to form the upper diffusion region 20, and the lower impurity region 31 in which the lower implantation region 30a has diffused to some extent is further thermally diffused to form the lower diffusion region 30.

At this time, the impurity concentration of the lower impurity region 31 caused by the lower implantation region 30a has a peak on the axis A at a position deeper than the upper implantation region 20a. When the upper implantation region 20a is thermally diffused in the second annealing, the conductive type is hardly reversed in the vicinity of the center of the disc-shaped upper implantation region 20a. After the second annealing has been performed, the cross-sectional shape passing through the axis A of the upper diffusion region 20 is recessed toward the vicinity of the axis A. In other word, the upper diffusion region 20 is formed in a disc shape whose center is recessed. In the PN junction surface S, a portion of the upper diffusion region 20, which intersects with the axis A, is formed in a concave shape which is recessed toward the main surface 10a.

A depth of formation of the lower diffusion region 30 after thermal diffusion may be designed to be substantially the same as a diameter R of ion implantation in the lower implantation region 30a. Parameters of an annealing temperature, an ion implantation energy, an impurity concentration, and the like may be determined by process commonality with other elements formed in the semiconductor substrate 10, and various values may be difficult to change. Therefore, designing the formation depth of the lower diffusion region 30 to be substantially the same as the diameter R of the ion implantation of the lower implantation region 30a means that a formation radius of the lower implantation region 30a is adjusted to an expected formation depth of the lower diffusion region 30.

In FIG. 10D, a contour line shown in the lower diffusion region 30 indicates a contour line of the impurity concentration, and indicates that a peak of the impurity concentration in the lower diffusion region 30 is located below the recess in the upper diffusion region 20.

Although not shown in particular, a semiconductor device shown in FIG. 8 is manufactured by forming a silicide block layer 40 in the same manner as that in the first embodiment, whereby a semiconductor device shown in FIG. 8 is manufactured.

In the present embodiment, the diode device 1 is provided to have the local maximum P1 in the lower diffusion region 30 in the impurity concentration profile. The position at which the breakdown phenomenon occurs may be limited, and the same effects as those of the first embodiment may be obtained.

In the present embodiment, the diameter R of the lower implantation region 30a is substantially the same as the assumed depth of formation of the lower diffusion region 30. According to the above configuration, the local maximum P2 of the impurity concentration in the lower diffusion region 30 may be easily formed in a point shape.

For example, when the formation diameter R of the lower implantation region 30a is greater than the assumed formation depth of the lower diffusion region 30, the lower diffusion region 30 is likely to have a substantially parallel portion to the main surface 10a in the portion opposite to the main surface 10a. In other word, the configuration of the first embodiment is easily obtained. In that situation, in the lower diffusion region 30, the local maximum P2 of the impurity concentration is likely to be distributed one-dimensional manner or two-dimensional manner in the direction along the main surface 10a. When the formation diameter R of the lower implantation region 30a is smaller than the assumed formation depth of the lower diffusion region 30, the local maximum P2 of the impurity concentration is easily distributed in one or two dimensional manners extending in the depth direction of the semiconductor substrate 10.

On the other hand, the diameter R of the lower implantation region 30a is set to be substantially the same as the assumed formation depth of the lower diffusion region 30 as in the present embodiment, thereby being capable of easily forming the local maximum P2 of the impurity concentration in the lower diffusion region 30 in a point shape.

In the present embodiment, annealing is performed twice when the semiconductor device is produced. Therefore, recrystallization may be expected by annealing, and crystal defects may be reduced.

Fourth Embodiment

The following describes a fourth embodiment. In the present embodiment, the configuration of the lower diffusion region 30 is changed from that in the third embodiment. Other configurations are the same as those of the third embodiment, and therefore a description of the similar configurations will not be described.

Figure 11:
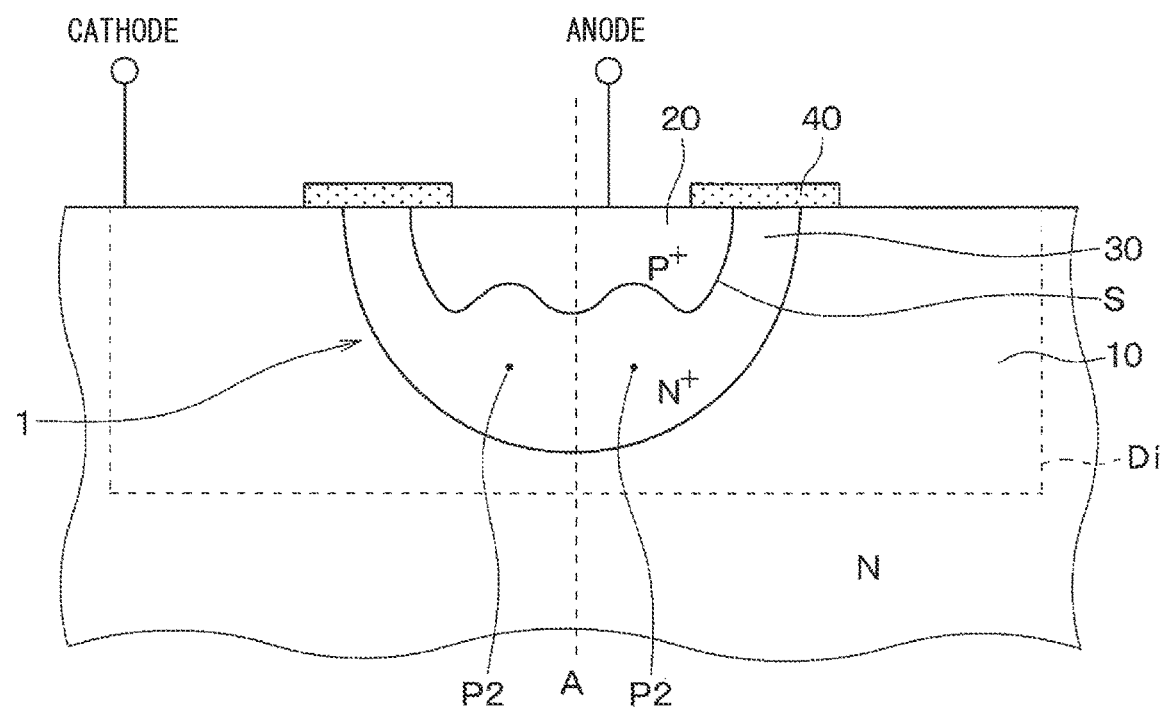
FIG. 11 is a cross-sectional view of a semiconductor device according to a fourth embodiment.

In the present embodiment, as shown in FIG. 11, a cross-sectional shape passing through an axis A of an upper diffusion region 20 has a recessed shape around a portion passing through the axis A. In a PN junction surface S, a portion intersecting with the axis A is a convex shape, and a portion located around the portion intersecting with the axis A is a concave shape which is recessed toward the main surface 10a. In other words, the PN junction surface S is provided to have a curved surface in a portion opposite to the main surface 10a side.

In the diode device 1, in the impurity concentration profile, a local maximum P2 is formed below a portion of the lower diffusion region 30 in which the PN junction surface S is recessed. In practice, since the upper diffusion region 20 and the lower diffusion region 30 are each formed in a disc shape, the local maximum P2 is also a part of a circle having an axis A as a symmetry axis. In other word, the local maximum P2 of the impurity concentration of the lower diffusion region 30 in the present embodiment is one-dimensional manner distributed around the axis A (specifically circular).

The configuration of the semiconductor device according to the present embodiment is described above. The following describes a method for manufacturing the semiconductor device with reference to FIGS. 12A to 12D.

Figure 12A:
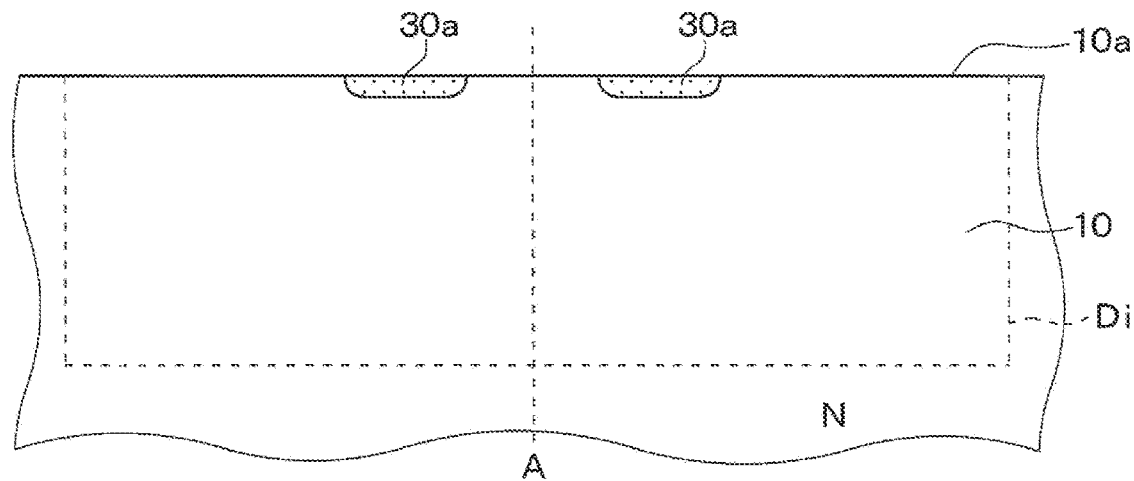
FIG. 12A is a cross-sectional view showing a process of manufacturing the semiconductor device shown in FIG. 11.

As shown in FIG. 12A, a semiconductor substrate 10 of an N conductivity type is prepared, and ions of phosphorus or arsenic are implanted to form a lower implantation region 30a. The lower implantation region 30a is formed in a rotationally symmetrical shape with the axis A as the symmetry axis. In the present embodiment, the lower implantation region 30a is formed in a toric shape or an annular shape. The lower implantation region 30a described above is formed by changing the patterning of the photoresist. Further, although two lower implantation regions 30a are illustrated in FIG. 12A, those lower implantation regions 30a are actually formed continuously in a front-back direction of the paper plane.

Figure 12B:
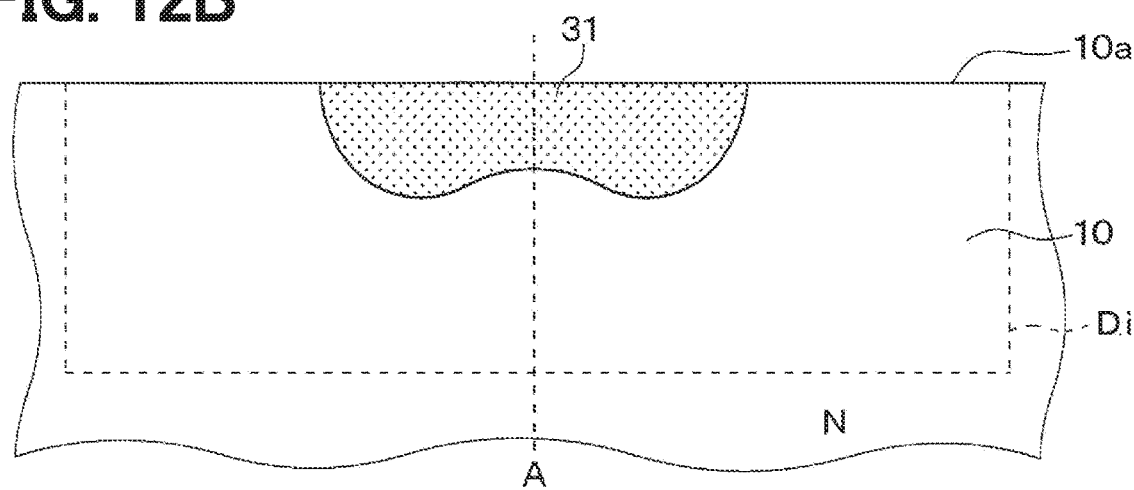
FIG. 12B is a cross-sectional view showing a process of manufacturing the semiconductor device subsequent to FIG. 12A.

As shown in FIG. 12B, a first annealing is performed. As a result, the lower implantation region 30a is thermally diffused to form an N conductivity type lower impurity region 31. Since the lower implantation region 30a before annealing is toric or annular, the impurity concentration structure in the lower impurity region 31 after thermal diffusion is a substantially torus structure in which a high concentration portion is distributed in a circular shape with the axis A as the symmetry axis.

Figure 12C:
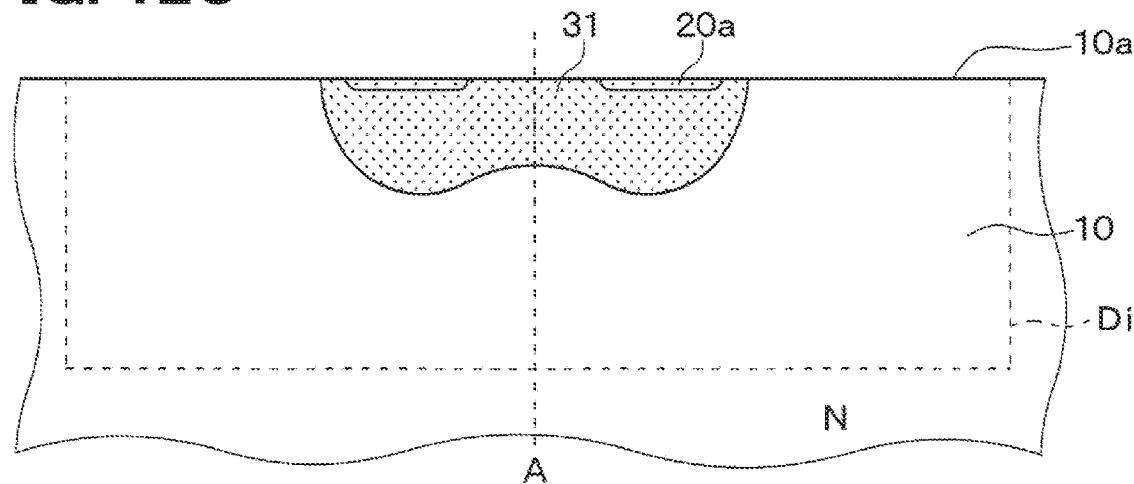
FIG. 12C is a cross-sectional view showing a process of manufacturing the semiconductor device subsequent to FIG. 12B.

As shown in FIG. 12C, ions of boron are implanted to form an upper implantation region 20a in the lower impurity region 31. The upper implantation region 20a is formed above a portion of the lower impurity region 31 in which the concentration becomes peak. In other words, the upper implantation region 20a is formed in a rotationally symmetrical shape with the axis A as an object axis.

The lower implantation region 30a is formed in a toric shape or an annular shape, and the impurity concentration structure of the lower impurity region 31 has a circular shape at a high concentration portion. Therefore, the upper implantation region 20a is formed in a toric shape or an annular shape. The upper implantation region 20a is formed at substantially the same position as the position where the lower implantation region 30a is formed. The upper implantation region 20a is formed by changing the patterning of a photoresist. In FIG. 12C, two upper implantation regions 20a are illustrated, but those lower implantation regions 30a are actually continuous in the front-back direction of the paper plane.

Figure 12D:
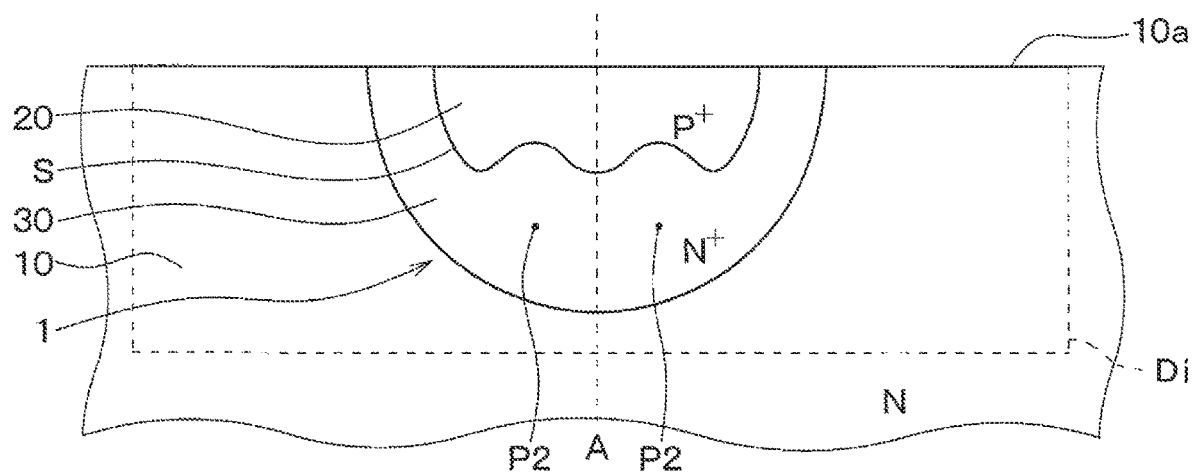
FIG. 12D is a cross-sectional view showing a process of manufacturing the semiconductor device subsequent to FIG. 12C.

As shown in FIG. 12D, a second annealing is performed to provide the upper diffusion region 20 and the lower diffusion region 30. At this time, similarly to the third embodiment, the conductivity type is hardly inverted in the portion where the impurity concentration in the lower impurity region 31 is high. Therefore, in the cross-sectional shape passing through the axis A of the upper diffusion region 20, the portion located around the axis A is recessed. Then, in the lower diffusion region 30, a local maximum P2 is provided in a portion located below a recess portion in the PN junction surface S, which is a portion located around the axis A.

As described above, in the diode device 1 according to the present embodiment, the local maximum P2 is one-dimensional manner distributed in the lower diffusion region 30 in the impurity concentration profile. In the present embodiment, a position at which a breakdown phenomenon occurs may be defined as a line. Therefore, as compared with the configuration in which the breakdown phenomenon occurs three-dimensional manner as in the comparative semiconductor device, the occurrence position of the breakdown phenomenon may be limited, and the same effects as those in the third embodiment may be obtained.

Fifth Embodiment

The following describes a fifth embodiment. In the present embodiment, the first embodiment and the third embodiment are combined together so that local maximums P1 and P2 of an impurity concentration are present in an upper diffusion region 20 and a lower diffusion region 30, respectively. The other configurations are the same as those of the first embodiment, and therefore a description of the similar configurations will not be described in the following.

Figure 13:
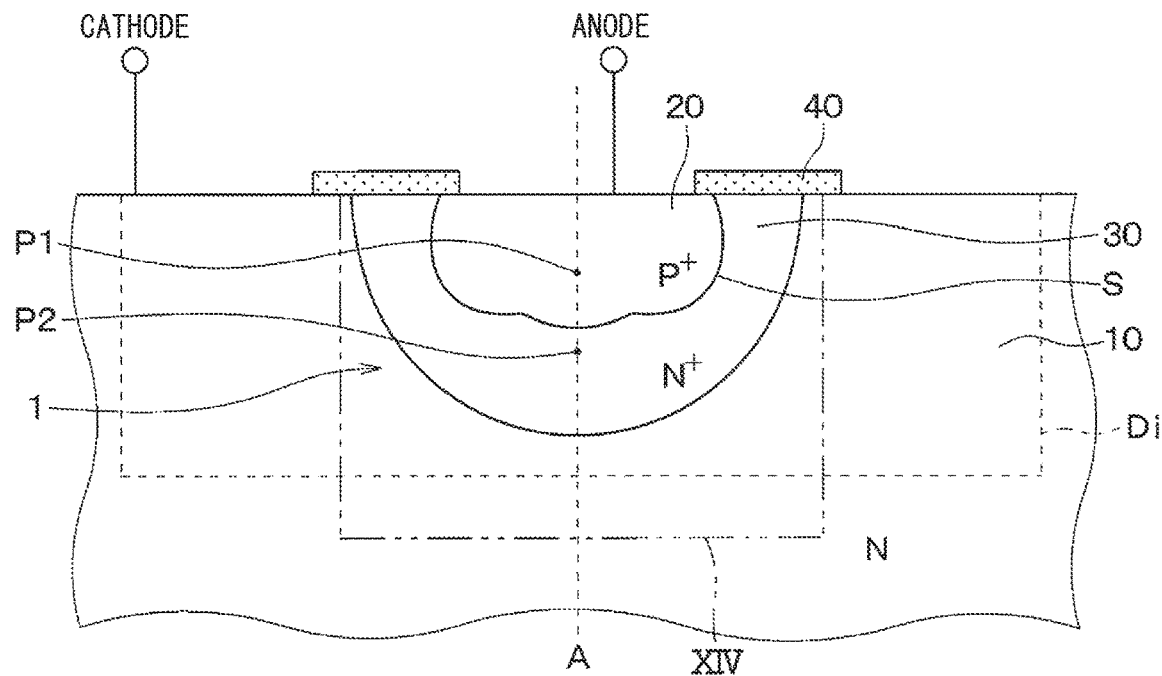
FIG. 13 is a cross-sectional view of a semiconductor device according to a fifth embodiment.

The semiconductor device according to the present embodiment, as shown in FIG. 13, is obtained by combining the upper diffusion region 20 of the first embodiment and the lower diffusion region 30 of the third embodiment together. In other words, in the present embodiment, a cross-sectional shape passing through an axis A of the upper diffusion region 20 has a structure in which a portion through which the axis A passes is bulged on a side opposite to a main surface 10a as in the above first embodiment. In other word, the PN junction surface S has a structure in which a portion intersecting with the axis A is distant from the most main surface 10a, and has a curved surface.

In a cross-sectional shape passing through the axis A of the lower diffusion region 30, a portion most distant from the main surface 10a is a curved surface as in the above third embodiment.

Figure 14:
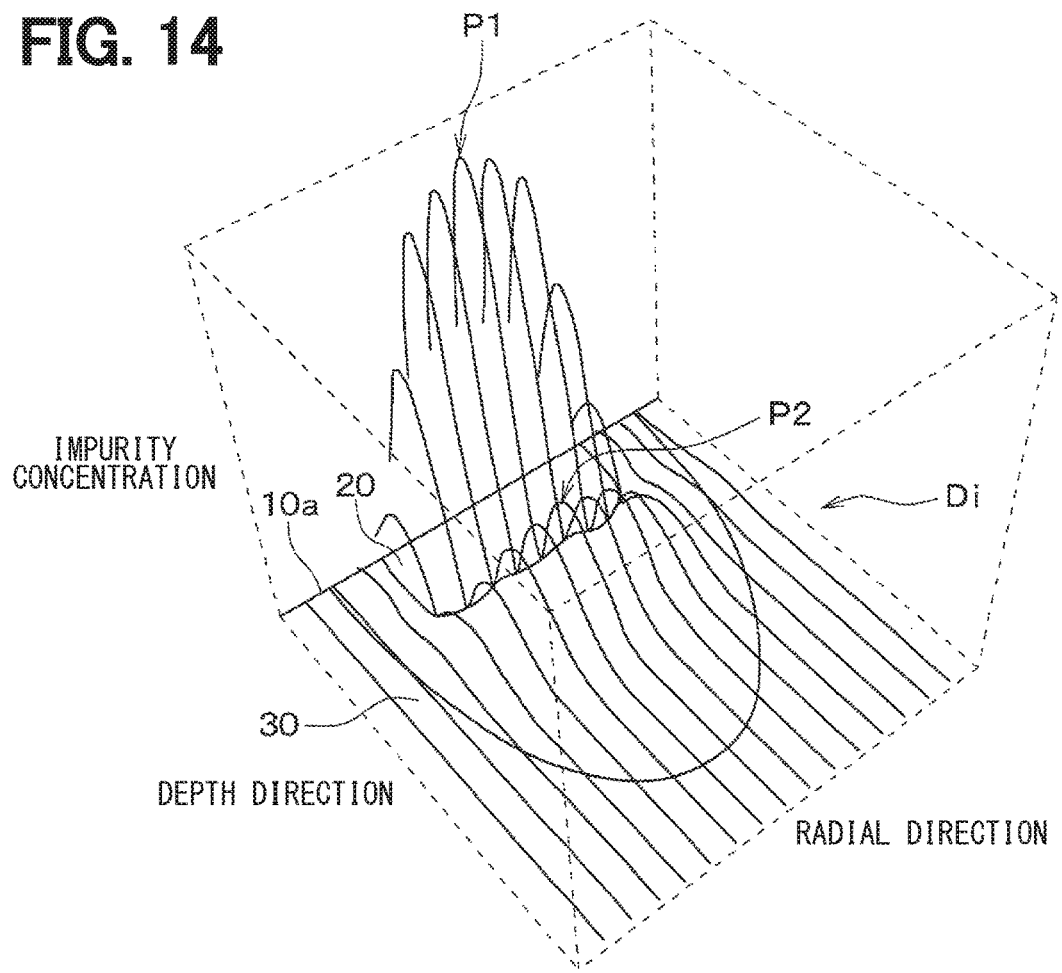
FIG. 14 is a diagram showing a three-dimensional profile of an impurity concentration in a region XIV in FIG. 13.

In the diode device 1, as shown in FIG. 14, a local maximum P1 is provided in the upper diffusion region 20, and a local maximum P2 is provided in the lower diffusion region 30 in the impurity concentration profile. Specifically, in the diode device 1, the local maximum P1 is provided on the axis A and above the PN junction surface S, and the local maximum P2 is provided below the PN junction surface S in the impurity concentration profile.

The configuration of the semiconductor device according to the present embodiment is described above. The semiconductor device described above is manufactured, for example, by combining the method for manufacturing the semiconductor device according to the first embodiment and the method for manufacturing the semiconductor device according to the third embodiment together.

In other word, the lower implantation region 30a is formed by performing the process shown in FIG. 10A, and the lower impurity region 31 is formed by performing the process shown in FIG. 10B. The processes shown in FIGS. 5B and 5C are performed to form the first upper implantation region 21 and the second upper implantation region 22; therefore, the upper implantation region 20a is formed. The upper diffusion region 20 and the lower diffusion region 30 are formed by performing the process of FIG. 5D to manufacture the semiconductor device shown in FIG. 13.

At this time, the impurity concentration of the lower diffusion region 30 has a peak on the axis A at a position deeper than the upper diffusion region 20, and the impurity concentration of the upper diffusion region 20 also has a peak of the impurity concentration on the axis A. According to the third embodiment, the portion of the upper diffusion region 20 which intersects with the axis A has a bulging shape. As shown in FIG. 13, the semiconductor device having the local maximum P1 provided in the upper diffusion region 20 and the local maximum P2 provided in the lower diffusion region 30 is manufactured.

Even when the upper diffusion region 20 and the lower diffusion region 30 have the local maximum impurity concentrations P1 and P2, respectively, the position at which the breakdown phenomenon occurs may be limited, and the same effects as those of the first and third embodiments may be obtained.

An example in which the first embodiment and the third embodiment are combined together has been described, but the first embodiment and the fourth embodiment can also be combined together. The second embodiment may be combined with the third embodiment or the fourth embodiment.

Sixth Embodiment

The following describes a sixth embodiment. In the present embodiment, an inter-electrode region is added to the third embodiment. The other configurations are the same as those of the first embodiment, and therefore a description of the similar configurations will not be described in the following.

In the semiconductor device according to the third embodiment or the like, when a breakdown occurs, there is a situation where the depletion layer extends to a wide area outside a lower diffusion region 30 in a surface layer of a semiconductor substrate 10. This is presumed to be caused by a surface trap in the surface layer of the semiconductor substrate 10. When the depletion layer is thus elongated, an electrical resistance of a current path between an upper diffusion region 20 as an anode and a cathode is increased, which causes a factor of temporal fluctuation of a Zener voltage.

Figure 15:
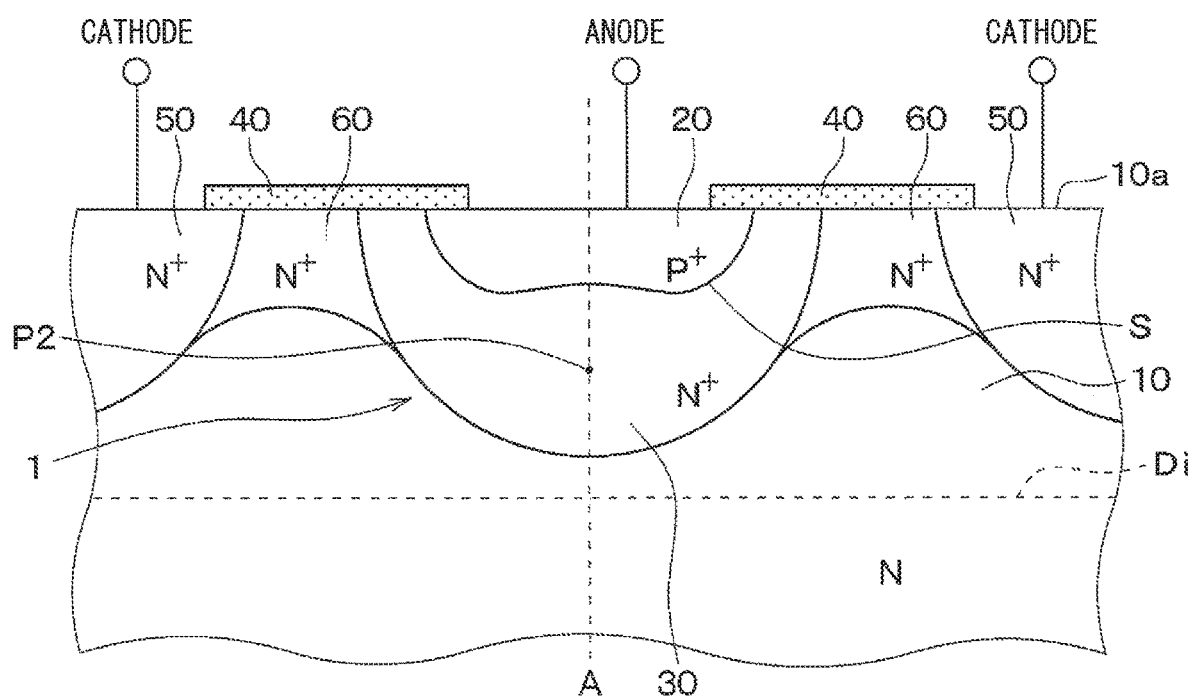
FIG. 15 is a cross-sectional view of a semiconductor device according to a sixth embodiment.

In the present embodiment, as shown in FIG. 15, a cathode region 50 and an inter-electrode region 60 are formed within a diode region Di in addition to the upper diffusion region 20 and the lower diffusion region 30 in the semiconductor substrate 10.

The cathode region 50 is of an N conductivity type, and has the impurity concentration higher than that of the semiconductor substrate 10. Then, the cathode region 50 is formed on a main surface 10a side of the semiconductor substrate 10 at a position away from the lower diffusion region 30. When viewed from the normal direction, the cathode region 50 is formed in a toric shape or an annular shape concentric with the upper diffusion region 20. The cathode region 50 is exposed from the main surface 10a, and the exposed portion is ohmically bonded to a cathode electrode. In the present embodiment, since the cathode region 50 is formed in the same process as that of the lower diffusion region 30, an average impurity concentration is substantially equal to that of the lower diffusion region 30. The cathode region 50 according to the present embodiment may also be referred to as a counter electrode region.

The inter-electrode region 60 is of an N conductivity type, and has the impurity concentration higher than that of the semiconductor substrate 10. The inter-electrode region 60 is formed on the main surface 10a side of the semiconductor substrate 10, and between the lower diffusion region 30 and the cathode region 50 so as to come in contact with each of the lower diffusion region 30 and the cathode region 50. As a result, a region surrounded by the cathode region 50 is provided such that the semiconductor region of the N conductivity type provided in the semiconductor substrate 10 is not exposed on the main surface 10a. In other word, in the main surface 10a, the distribution of the radial impurities in the radial direction as viewed from a center of the upper diffusion region 20 is spread concentrically in a stated order of the P conductivity type of the upper diffusion region 20, the N conductivity type of the lower diffusion region 30 exposed from the main surface 10a, the N conductivity type of the inter-electrode region 60, and the N conductivity type of the cathode region 50.

The semiconductor device according to the present embodiment, the inter-electrode region 60 is formed as a separate process from the process of forming the lower diffusion region 30 and the cathode region 50. Therefore, the impurity concentration in the inter-electrode region 60 may be controlled independently of the lower diffusion region 30 and the cathode region 50. However, the impurity concentration of the inter-electrode region 60 may be set lower than that of the cathode region 50 to which the cathode electrode is connected, higher than that of the semiconductor substrate 10, and lower than the local maximum value of the impurity concentration of the lower diffusion region 30. A place where the impurity concentration of the lower diffusion region 30 in the present embodiment becomes maximum is the local maximum P2 of the impurity concentration, and the local maximum P2 is formed substantially as a point (that is, 0-dimensional) and becomes a breakpoint. Therefore, the impurity concentration of the inter-electrode region 60 is set to be lower than the breakpoint, thereby being capable of inhibiting the occurrence of breakdown in the vicinity of the inter-electrode region 60. In other word, breakdown may be intentionally generated in the lower diffusion region 30.

In the present embodiment, the silicide block layer 40 is formed so that the inner edge of the toric shape or the annular shape extends across the upper diffusion region 20 and the outer edge of the toric shape or the annular shape extends across the cathode region 50. In other word, the silicide block layer 40 is formed so as to completely cover the exposed portion of the lower diffusion region 30 and the inter-electrode region 60 in the main surface 10a.

The configuration of the semiconductor device according to the present embodiment is described above. The following describes a method for manufacturing the semiconductor device with reference to FIGS. 16A to 16C.

Figure 16A:
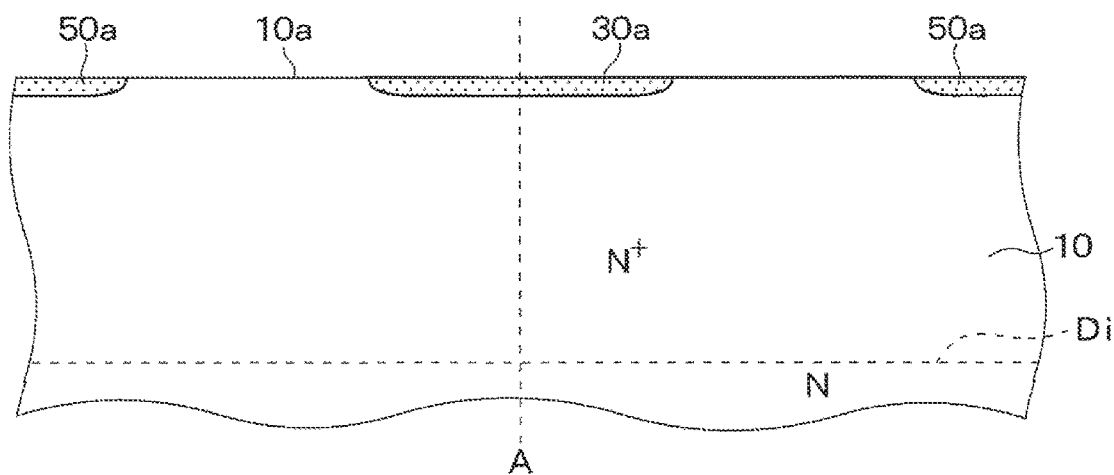
FIG. 16A is a cross-sectional view showing a process of manufacturing the semiconductor device shown in FIG. 15.

As shown in FIG. 16A, a semiconductor substrate 10 of the N conductivity type is prepared. Then, similarly to the third embodiment, a lower implantation region 30a is formed by ion implantation. At this time, the cathode implantation region 50a is formed by the same or different process as that of the lower implantation region 30a. The lower implantation region 30a and the cathode implantation region 50a are each formed in the surface layer portion of the main surface 10a. The cathode implantation region 50a is a region that becomes the cathode region 50 by annealing.

Figure 16B:
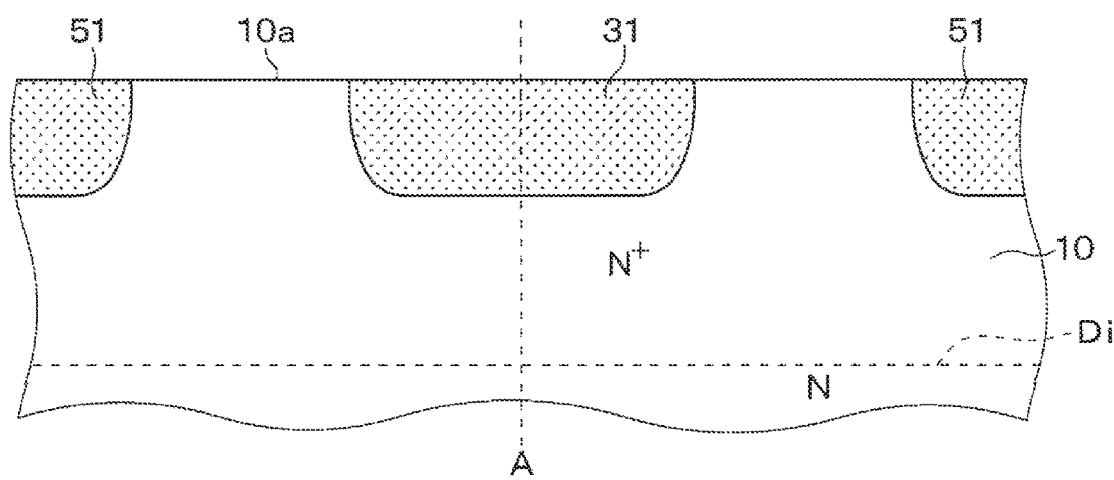
FIG. 16B is a cross-sectional view illustrating a process of manufacturing the semiconductor device subsequent to FIG. 16A.

As shown in FIG. 16B, a first annealing is performed to form the lower impurity region 31 from the lower implantation region 30a and to form the cathode impurity region 51 from the cathode implantation region 50a.

Figure 16C:
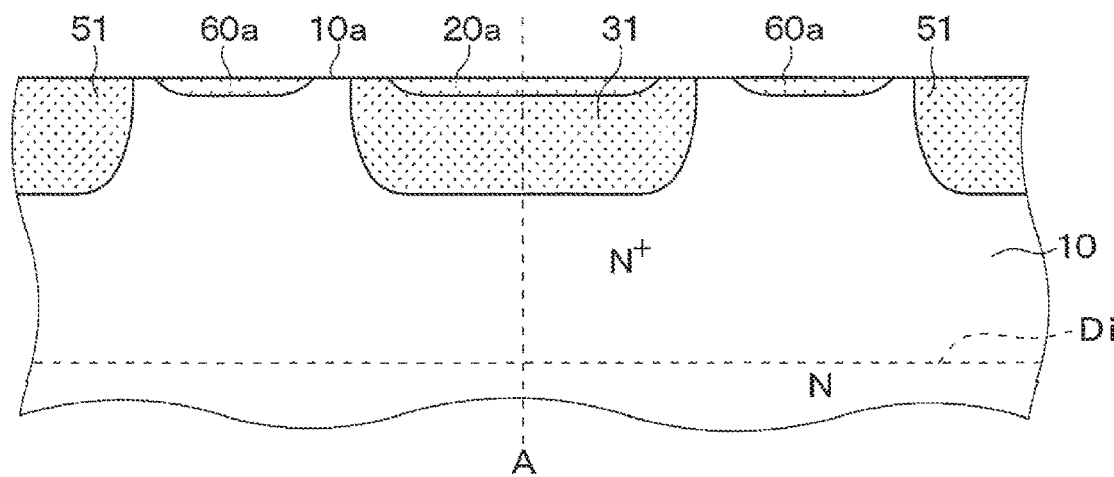
FIG. 16C is a cross-sectional view showing a process of manufacturing the semiconductor device subsequent to FIG. 16B.

As shown in FIG. 16C, a process similar to that of FIG. 10C is performed to form an upper implantation region 20a in the lower impurity region 31. Additionally, ion implantation is performed on a surface layer of the main surface 10a surrounded by the lower implantation region 30a and the cathode implantation region 50a to form an N conductivity type inter-electrode implantation region 60a. The inter-electrode implantation region 60a is a region that becomes the inter-electrode region 60 by annealing.

Figure 16D:
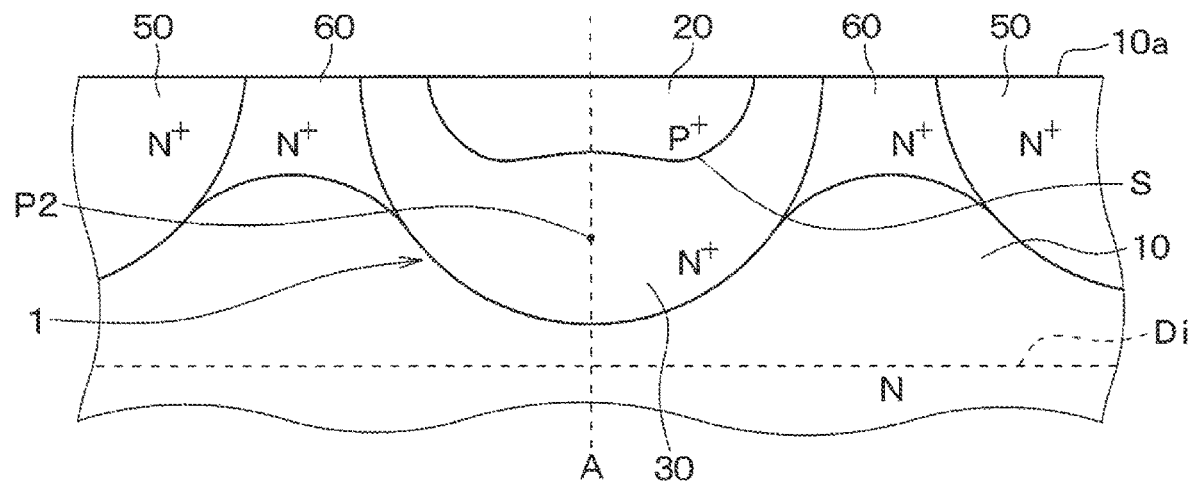
FIG. 16D is a cross-sectional view showing a process of manufacturing the semiconductor device subsequent to FIG. 16C.

As shown in FIG. 16D, a second annealing is performed. As a result, the lower diffusion region 30 is formed, and the upper diffusion region 20 is formed. The cathode impurity region 51 is provided in the cathode region 50, and the inter-electrode implantation region 60a is provided in the inter-electrode region 60.

Although not shown in particular, a semiconductor device shown in FIG. 15 is manufactured by forming a silicide block layer 40. The silicide block layer 40 is formed so that the inner edge of the toric shape or the annular shape extends across the upper diffusion region 20 and the outer edge of the toric shape or the annular shape extends across the cathode region 50.

In the present embodiment, the cathode region 50 is provided, and the inter-electrode region 60 higher in concentration than the semiconductor substrate 10 is formed so that the semiconductor region of the N conductivity type provided in the semiconductor substrate 10 from between the cathode region 50 and the lower diffusion region 30 is not exposed. Therefore, the depletion layer extending from the upper diffusion region 20 can hardly enter the inter-electrode region 60, and an increase in electrical resistance between the upper diffusion region 20 and the cathode region 50 may be inhibited. Therefore, the fluctuation of the Zener voltage with time may be further inhibited.

Seventh Embodiment

The following describes a seventh embodiment. In the present embodiment, the method for manufacturing the inter-electrode region 60 is changed from that in the sixth embodiment. Other configurations are the same as those of the sixth embodiment, and therefore a description of the similar configurations will not be described.

In the sixth embodiment, an example has been described in which the inter-electrode implantation region 60a is formed as a process different from that of ion implantation of impurities in the lower diffusion region 30 and the cathode region 50 when the inter-electrode region 60 is formed. However, the process of forming the inter-electrode implantation region 60a may be omitted by bringing the positions at which the lower diffusion region 30 and the cathode region 50 are formed close to each other.

Figure 17:
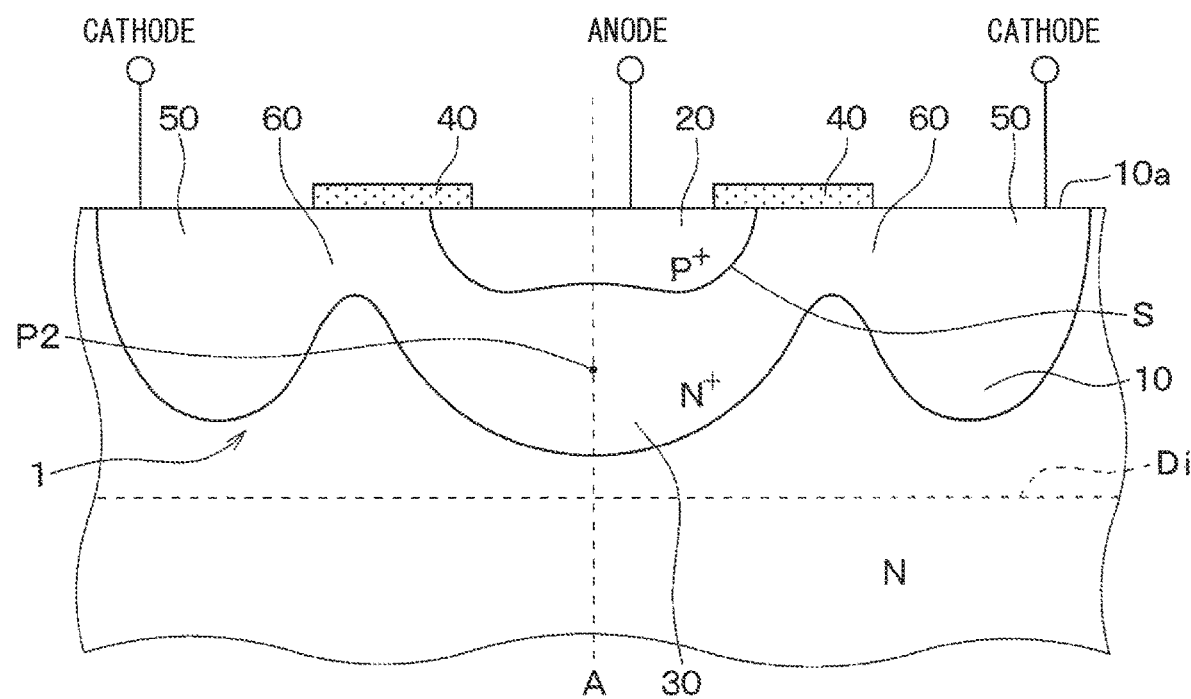
FIG. 17 is a cross-sectional view showing a process of manufacturing a semiconductor device according to a seventh embodiment.

In other word, in the present embodiment, as shown in FIG. 17, the inter-electrode region 60 is formed of a portion in which the lower diffusion region 30 and the cathode region 50 overlap with each other. The inter-electrode region 60 is of an N conductivity type, and has a concentration higher than the impurity concentration in the semiconductor substrate 10, as in the sixth embodiment.

In the situation of the configuration described above, for example, in the sixth embodiment, when the lower implantation region 30a and the cathode implantation region 50a described with reference to FIG. 16B are formed, the lower implantation region 30a and the cathode implantation region 50a may be laid out with a short separation distance from each other. As a result, regions in which impurities are thermally diffused by annealing after ion implantation overlap with each other to form the inter-electrode regions 60.

In the present embodiment, the processes for forming the inter-electrode implantation region 60a are reduced. Therefore, the same effects as those of the sixth embodiment may be obtained while simplifying the manufacturing process.

Other Embodiments

Although the present disclosure has been described in accordance with embodiments, it is understood that the present disclosure is not limited to such embodiments or structures. The present disclosure encompasses various modifications and variations within the scope of equivalents. In addition, various combinations and configurations, as well as other combinations and configurations that include only one element, more, or less, are within the scope and spirit of the present disclosure.

For example, in each of the embodiments described above, the first conductivity type may be an N conductivity type, and the second conductivity type may be a P conductivity type. However, in the situation where the inter-electrode region 60 is provided as in the sixth embodiment and the seventh embodiment, the counter electrode region corresponding to the cathode region 50 and the lower diffusion region 30 may have the same conductivity type as that of the semiconductor substrate 10.

In each of the embodiments, the shape of the upper diffusion region 20 when viewed from the normal direction is not limited to a perfect circular shape as described above, and the upper diffusion region 20 may have a symmetrical shape n times. For example, the shape of the upper diffusion region 20 when viewed from the normal direction may be an ellipse or capsule shape (that is, twice symmetric), an equilateral triangle (that is, three times symmetric), a square (that is, four times symmetric), a regular pentagon (that is, five times symmetric), a regular hexagon (that is, six times symmetric), or the like. In the same manner, the lower diffusion region 30, when viewed from the normal direction, may be n-fold symmetrical shape rather than a perfect circular shape. In the twice symmetrical shape, the local maximums P1 and P2 of the impurity concentration are not points but linear along the long side (that is, one-dimensional).

In each of the embodiments, the upper diffusion region 20 and the lower diffusion region 30 may have shape similar to each other when viewed from the normal direction. Since the upper diffusion region 20 and the lower diffusion region 30 have symmetry, a break point may be easily formed in one or 0 dimensions lower than the three dimensions.

In each of the embodiments, an example has been described in which the silicide block layer 40 is formed so as to have the same center as that of the upper diffusion region 20 and the lower diffusion region 30, however, the present disclosure is not limited to the above example, and the formation center may be deviated from each other. The silicide block layer 40 is not necessary in some situations when the electrode is not formed by silicide, and is not an essential element in such a form.

In each of the embodiments, the lower diffusion region 30 may be provided not to be exposed from the main surface 10a. However, when the lower diffusion region 30 is exposed from the main surface 10a while covering the upper diffusion region 20, as described above, in the surface layer of the main surface 10a, the depletion layer caused by the upper diffusion region 20 of the P conductivity type may be inhibited from spreading in a direction along the main surface 10a. In other word, the hot carriers may be inhibited from being trapped to the level caused by the surface defects present in the vicinity of the main surface 10a, and the amount of fluctuation of the Zener voltage with time may be inhibited. Therefore, the lower diffusion region 30 is exposed from the main surface 10a. In this respect, with the provision of the cathode region 50 and the inter-electrode region 60, the amount of fluctuation of the Zener voltage with time may be further inhibited.

If the lower diffusion region 30 is not exposed from the main surface 10a, the silicide block layer 40 may be formed so as to extend across a boundary line between the upper diffusion region 20 and the semiconductor region in the semiconductor substrate 10.

In each of the embodiments, the semiconductor device having the Zener diode formed on the semiconductor substrate 10 has been described, but other elements may be formed. For example, in the same semiconductor substrate 10, a semiconductor device such as a MOSFET (abbreviation for Metal Oxide Semiconductor Field Effect Transistor) or an IGBT (abbreviation for Insulated Gate Bipolar Transistor) may be formed in a region different from the diode region Di.

In each of the embodiments, an example in which at least one of the upper diffusion region 20 and the lower diffusion region 30 has the local maximums P1 and P2 of the impurity concentration has been described. However, as described in the sixth and seventh embodiments, the formation of the inter-electrode region 60 may also inhibit the fluctuation of the Zener voltage with time. In other word, the effect of providing the inter-electrode region 60 may be regarded as an independent effect from the configuration in which the local maximums P1 and P2 of the impurity concentration are provided in at least one of the upper diffusion region 20 and the lower diffusion region 30. Therefore, as compared with the comparative semiconductor device, the fluctuation of the Zener voltage with time may be inhibited by forming only the inter-electrode region 60.

The semiconductor device according to the fifth embodiment may be manufactured as a following example. In other word, after the lower implantation region 30a has been formed by performing the process of FIG. 5A, ion implantation is performed again at a portion intersecting with the axis A in the lower implantation region 30a, so that the inner edge of the lower implantation region 30a has a larger dose amount than that of the outer edge. Thereafter, the processes shown in FIG. 5B and the subsequent figures may be performed.

According to the above configuration, since the impurity concentration of the portion located on the axis A of the lower diffusion region 30 is easily increased by performing annealing in the process in FIG. 5D, the portion of the lower diffusion region 30 which intersects with the axis A is configured to bulge away from the main surface 10a. In other words, the lower diffusion region 30 has the same configuration as that of the upper diffusion region 20 according to the first embodiment. Even when the lower diffusion region 30 is formed, since a configuration having the local maximum P2 in the lower diffusion region 30 and having the local maximum P1 in the upper diffusion region 20 is provided, the same effects as those of fifth embodiment may be obtained.

Furthermore, the embodiments described above may be combined together as appropriate. For example, the first, second, fourth, and fifth embodiments may be combined with the sixth embodiment or the seventh embodiment, and the cathode region 50 and the inter-electrode region 60 may be provided.

What is claimed is:

1. A semiconductor device in which a diode device is disposed, the semiconductor device comprising:
   a semiconductor substrate of a second conductivity type having a main surface;
   an upper diffusion region of a first conductivity type which is disposed on the main surface of the semiconductor device; and
   a lower diffusion region of the second conductivity type which is disposed up to a position deeper than the upper diffusion region in a depth direction of the semiconductor substrate from the main surface as a reference, and has a higher impurity concentration than the semiconductor substrate,
   wherein the diode device includes a PN junction surface at an interface between the upper diffusion region and the lower diffusion region,
   wherein the PN junction surface has a curved surface disposed opposite to the main surface,
   wherein the diode device has a local maximum of an impurity concentration in the upper diffusion region in a profile of the impurity concentration,
   wherein a virtual line passing through a center of the upper diffusion region and extending along the depth direction in a normal direction to the main surface is denoted by an axis,
   wherein the curved surface has a portion of the PN junction surface intersecting with the axis, and the portion of the PN junction surface is disposed most distant from the main surface, and
   wherein the local maximum is located on the axis in the upper diffusion region.

2. A semiconductor device in which a diode device is disposed, the semiconductor device comprising:
   a semiconductor substrate of a second conductivity type having a main surface;
   an upper diffusion region of a first conductivity type which is disposed on the main surface of the semiconductor device; and
   a lower diffusion region of the second conductivity type which is disposed up to a position deeper than the upper diffusion region in a depth direction of the semiconductor substrate from the main surface as a reference, and has a higher impurity concentration than the semiconductor substrate,
   wherein the diode device includes a PN junction surface at an interface between the upper diffusion region and the lower diffusion region,
   wherein the PN junction surface has a curved surface disposed opposite to the main surface,
   wherein the diode device has a local maximum of an impurity concentration in the upper diffusion region in a profile of the impurity concentration,
   wherein a virtual line passing through a center of the upper diffusion region and extending along the depth direction in a normal direction to the main surface is denoted by an axis,
   wherein the curved surface has a surrounding portion surrounding a portion intersecting with the axis in the PN junction surface, and the surrounding portion is disposed most distant from the main surface, and
   wherein the local maximum is located above the surrounding portion of the PN junction surface in the upper diffusion region.

3. The semiconductor device according to claim 1, wherein, in the profile of the impurity concentration, the diode device has another local maximum of the impurity concentration in the lower diffusion region.

4. A semiconductor device in which a diode device is disposed, the semiconductor device comprising:
   a semiconductor substrate of a second conductivity type having a main surface;
   an upper diffusion region of a first conductivity type which is disposed on the main surface of the semiconductor device; and
   a lower diffusion region of the second conductivity type which is disposed up to a position deeper than the upper diffusion region in a depth direction of the semiconductor substrate from the main surface as a reference, and has a higher impurity concentration than the semiconductor substrate,
   wherein the diode device includes a PN junction surface at an interface between the upper diffusion region and the lower diffusion region,
   wherein the PN junction surface has a curved surface disposed opposite to the main surface, and
   wherein, in a profile of an impurity concentration, the diode device has a local maximum of an impurity concentration in the upper diffusion region and has another local maximum of the impurity concentration in the lower diffusion region.

5. The semiconductor device according to claim 1, wherein the lower diffusion region covers the upper diffusion region and is partially exposed from the main surface.

6. The semiconductor device according to claim 2,
wherein the axis passes through the center of the curved surface, and a distance between the recessed surface and the main surface shortens along a continuous curvature of the curved surface approaching the center of the curved surface.

7. The semiconductor device according to claim 1, further comprising:
a block layer, having an opening, formed on the upper diffusion region,
wherein the virtual line further passes through a center of the opening of the block layer and a center of the upper diffusion region.

8. The semiconductor device according to claim 7,
wherein the block layer is formed to extend across a boundary line between the upper diffusion region and the lower diffusion region.

* * * * *